(12) United States Patent
Kato et al.

(10) Patent No.: US 7,816,201 B2
(45) Date of Patent: Oct. 19, 2010

(54) SEMICONDUCTOR DEVICE AND METHOD OF MANUFACTURING THE SAME

(75) Inventors: Yoshiko Kato, Yokohama (JP); Shigeru Ishibashi, Kawasaki (JP); Mitsuhiro Noguchi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/500,912

(22) Filed: Jul. 10, 2009

(65) Prior Publication Data

US 2009/0275181 A1 Nov. 5, 2009

Related U.S. Application Data

(63) Continuation of application No. 11/671,229, filed on Feb. 5, 2007, now Pat. No. 7,569,898.

(30) Foreign Application Priority Data

Feb. 14, 2006 (JP) .............................. 2006-036869

(51) Int. Cl.
H01L 21/8238 (2006.01)

(52) U.S. Cl. .............................. 438/217; 257/E21.633; 438/199

(58) Field of Classification Search .................. 438/197, 438/199, 217, 275, 276, 286, 289, 291, 526, 438/527, 778; 257/E21.632, E21.633, E21.639
See application file for complete search history.

(56) References Cited

U.S. PATENT DOCUMENTS

| | | | |
|---|---|---|---|
| 6,043,128 A | 3/2000 | Kamiya | |
| 6,137,144 A | 10/2000 | Tsao et al. | |
| 6,207,510 B1 | 3/2001 | Abein et al. | |
| 6,267,479 B1 | 7/2001 | Yamada et al. | |
| 6,403,425 B1 | 6/2002 | Ang et al. | |
| 6,469,347 B1* | 10/2002 | Oda et al. | 257/345 |
| 6,740,939 B2* | 5/2004 | Sayama et al. | 257/371 |
| 7,087,474 B2 | 8/2006 | Mitsuda et al. | |
| 7,402,495 B2 | 7/2008 | Kajimoto et al. | |
| 2005/0029616 A1 | 2/2005 | Noda et al. | |
| 2007/0077719 A1 | 4/2007 | Koyama et al. | |

FOREIGN PATENT DOCUMENTS

| | | |
|---|---|---|
| JP | 2003-37250 | 3/2003 |
| KR | 10-2004-0054556 | 6/2004 |

* cited by examiner

*Primary Examiner*—Davienne Monbleau
*Assistant Examiner*—Eduardo A Rodela
(74) *Attorney, Agent, or Firm*—Oblon, Spivak, McClelland, Maier & Neustadt, L.L.P.

(57) ABSTRACT

A semiconductor device according to an example of the present invention includes a first semiconductor region of a first conductivity type, a first MIS transistor of a second conductivity type formed in the first semiconductor region, a second semiconductor region of a second conductivity type, and a second MIS transistor of a first conductivity type formed in the second semiconductor region. A first gate insulating layer of the first MIS transistor is thicker than a second gate insulating layer of the second MIS transistor, and a profile of impurities of the first conductivity type in a channel region of the second MIS transistor has peaks.

6 Claims, 23 Drawing Sheets

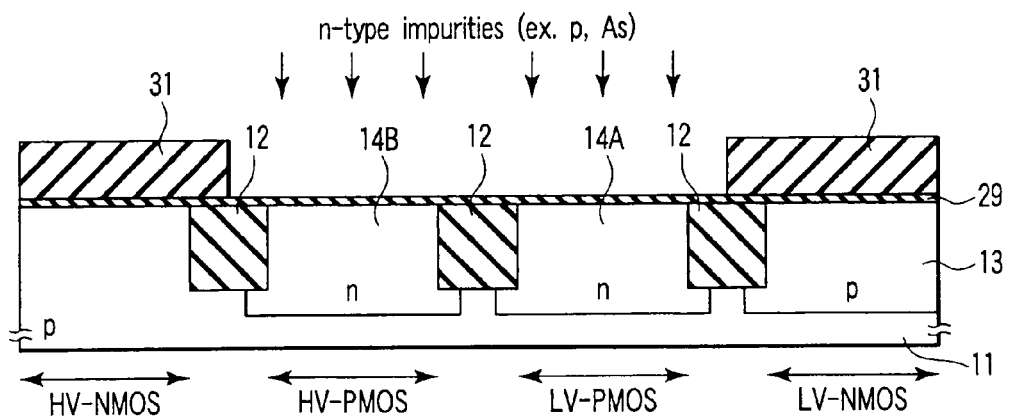
F I G. 15
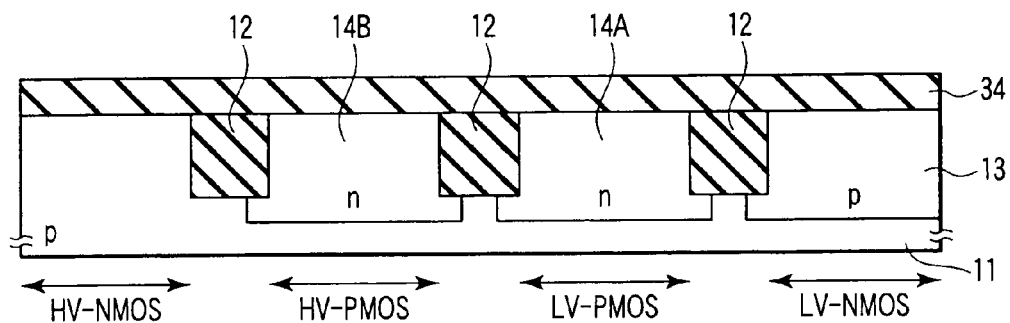
F I G. 16
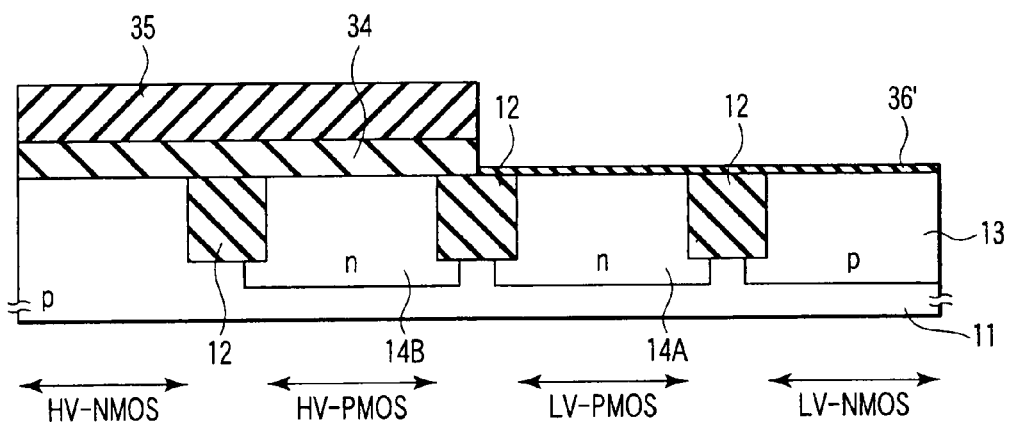
F I G. 17

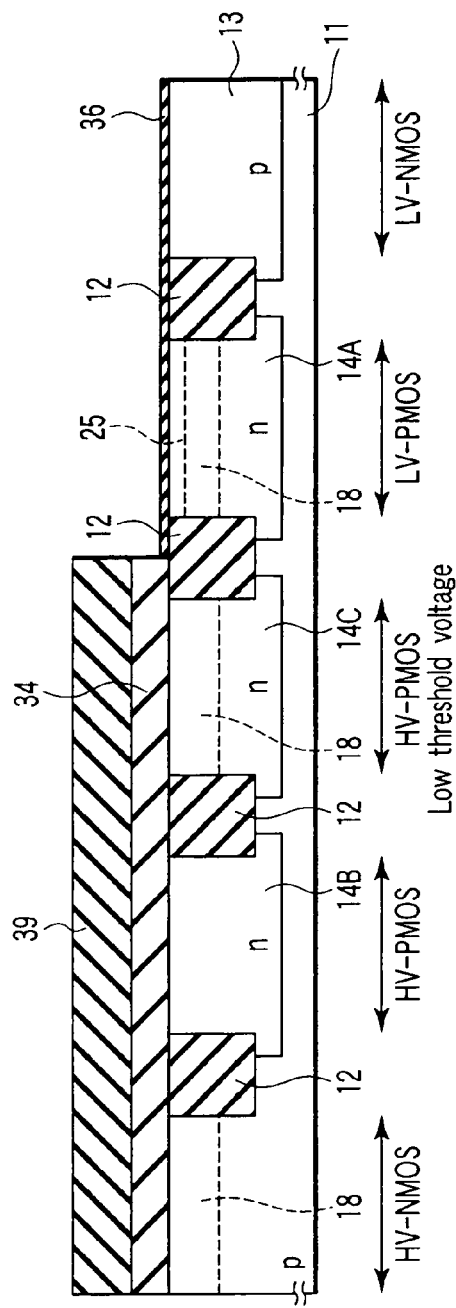
F I G. 3 5
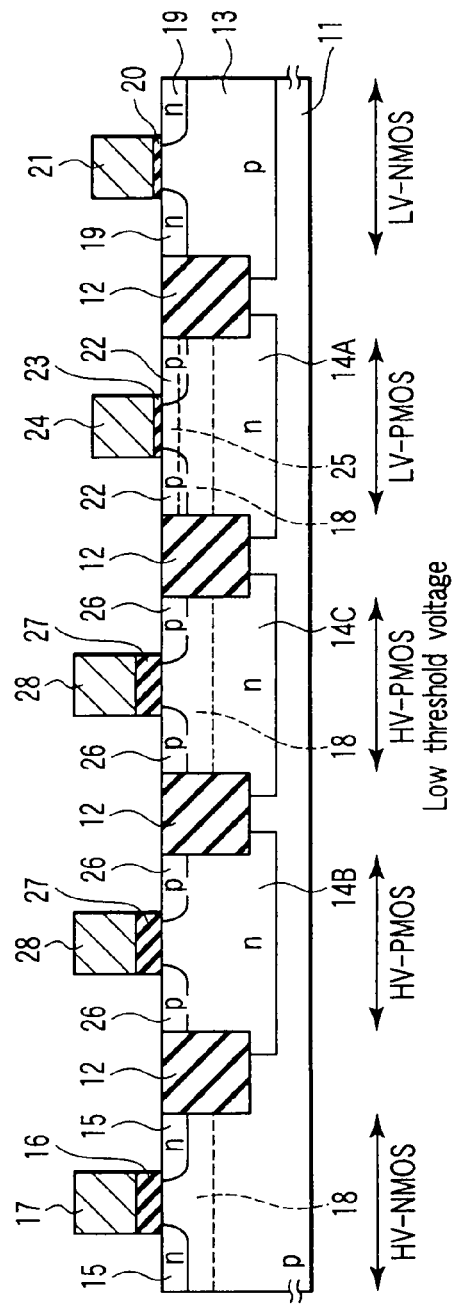
F I G. 3 6

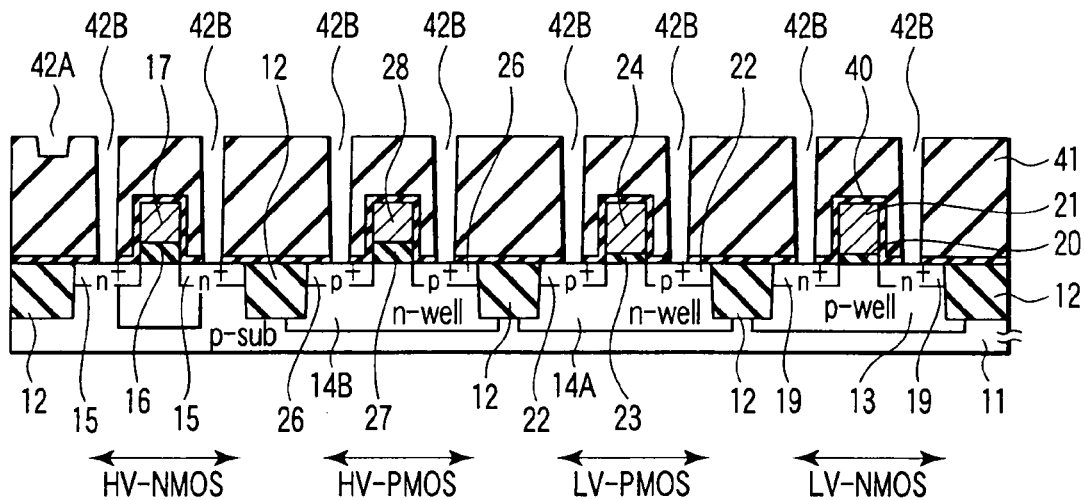
F I G. 40
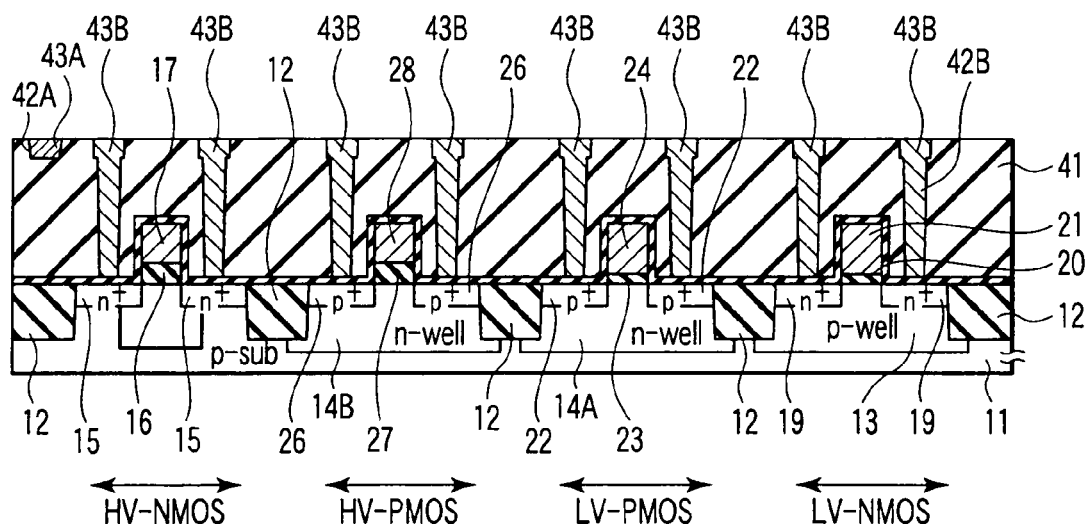
F I G. 41

SEMICONDUCTOR DEVICE AND METHOD OF MANUFACTURING THE SAME

CROSS-REFERENCE TO RELATED APPLICATIONS

This application is a continuation of U.S. application Ser. No. 11/671,229, filed Feb. 5, 2007, and claims the benefit of priority from prior Japanese Patent Application No. 2006-036869, filed Feb. 14, 2006, the entire contents of which are incorporated herein by reference.

BACKGROUND OF THE INVENTION

1. Field of the Invention

The present invention relates to a semiconductor device and a method of manufacturing the same, for instance, which is used for a nonvolatile semiconductor memory.

2. Description of the Related Art

In some of the semiconductor integrated circuits, voltages (except for 0V) are used in one chip (referring to Jpn. Pat. Appln. KOKAI Publication No. 2003-37250).

For instance, in a flash memory, for high-speed operation, at the time of erasing, a voltage of not less than 15V and not more than 40V is applied to a well, while at the time of reading/writing, its well voltage is made zero. Further, a peripheral circuit for switching the voltage of the well is driven with a voltage of not less than 1V and not more than 5V applied for low power consumption.

For this reason, it becomes necessary for the flash memory to be provided with a high-voltage transistor in which the voltage of not less than 15V is applied to its gate, and a low-voltage transistor in which the voltage of not less than 1V and not more than 5V is applied to its gate.

However, when such plural transistors with plural voltages are formed in one chip, the manufacturing process is complicated; accordingly, problems of variations of a threshold voltage or deterioration of a short channel effect by the manufacturing process occur.

BRIEF SUMMARY OF THE INVENTION

A semiconductor device according to an aspect of the present invention comprises a first semiconductor region of a first conductivity type, a first MIS transistor of a second conductivity type formed in the first semiconductor region, a second semiconductor region of a second conductivity type, and a second MIS transistor of a first conductivity type formed in the second semiconductor region, wherein a first gate insulating layer of the first MIS transistor is thicker than a second gate insulating layer of the second MIS transistor, and a profile of impurities of the first conductivity type in a channel region of the second MIS transistor has peaks.

A semiconductor device according to an aspect of the present invention comprises a first semiconductor region of a first conductivity type, a first MIS transistor of a second conductivity type formed in the first semiconductor region, a second semiconductor region of a second conductivity type, and a second MIS transistor of a first conductivity type formed in the second semiconductor region, wherein a first gate insulating layer of the first MIS transistor is thicker than a second gate insulating layer of the second MIS transistor, and a peak of a profile of impurities of the first conductivity type in a channel region of the first MIS transistor exists in the first gate insulating layer.

A method of manufacturing a semiconductor device according to an aspect of the present invention comprises forming a first insulating layer on a first semiconductor region of a first conductivity type, forming a second insulating layer thinner than the first insulating layer on a second semiconductor region of a second conductivity type, implanting an ion implantation of a first impurity simultaneously to the first and second semiconductor regions with a condition that a peak of a profile of the first impurity of a first conductivity type is formed in the first and second semiconductor regions, implanting an ion implantation of a second impurity simultaneously to the first and second semiconductor regions with a condition that a peak of a profile of the second impurity of a first conductivity type is formed in the first insulating layer, forming a first MIS transistor of a second conductivity type with the first insulating layer as a gate insulating layer in the first semiconductor region, and forming a second MIS transistor of a first conductivity type in the second semiconductor region.

BRIEF DESCRIPTION OF THE SEVERAL VIEWS OF THE DRAWING

FIG. 15 is a cross-sectional view showing one process of a method of manufacturing the semiconductor device of FIG. 11;

FIG. 16 is a cross-sectional view showing one process of a method of manufacturing the semiconductor device of FIG. 11;

FIG. 17 is a cross-sectional view showing one process of a method of manufacturing the semiconductor device of FIG. 11;

FIG. 35 is a cross-sectional view showing one process of a method of manufacturing the semiconductor device of FIG. 27;

FIG. 36 is a cross-sectional view showing one process of a method of manufacturing the semiconductor device of FIG. 27;

FIG. 40 is a cross-sectional view along line XL-XL of FIG. 39;

FIG. 41 is a cross-sectional view showing one process of the manufacturing method of the fourth embodiment;

DETAILED DESCRIPTION OF THE INVENTION

A semiconductor device and method of manufacturing the same of aspects of the present invention will be described below in detail with reference to the accompanying drawings.

1. Outline

In an example of the present invention, proposed is a structure in which an impurity profile in a channel region of a metal-insulator-semiconductor (MIS) transistor operating at a low voltage (hereinafter, referred to as a low-voltage transistor) has peaks in a semiconductor device having MIS transistors operating at different voltages.

Further, in the example of the present invention, proposed is a structure in which a peak of an impurity profile exists in a gate insulating layer of the MIS transistor operating at a high voltage (hereinafter, referred to as a high-voltage transistor).

Such structure is realized by adopting process that, at least, after forming the gate insulating layer of the high-voltage transistor, an ion implantation (hereinafter referred to as a channel implantation) for threshold control is implanted simultaneously to both a channel region of the low-voltage transistor and a channel region of the high-voltage transistor.

According to such structure and process, since at least the channel implantation is implanted after the gate insulating layer of the high-voltage transistor is formed, it is possible to realize both prevention of threshold voltage variations by so-called impurity suction (boron suction) of the channel region caused by high temperature heat treatment when forming its gate insulating layer, and improvement of the short channel effect caused by diffusion of the impurity.

Further, since the channel implantation is implanted simultaneously to both transistors while utilizing difference of thickness of the gate insulating layers of the low-voltage transistor and the high-voltage transistor, it is possible to reduce the number of photolithography process, thus it is possible to realize decrease of manufacturing cost due to simplification of manufacturing process.

The example of the present invention is effective to p-channel low-voltage transistor in which fluctuation of threshold voltage caused by the impurity suction is noticeable. Further, the example of the present invention is applied to a nonvolatile semiconductor memory having a peripheral circuit composed of the high-voltage transistor and the low-voltage transistor, for instance, NAND flash memory.

2. Reference Example

First, there will be described a reference example to be premised example of the present invention.

(1) Structure

Figure 1:
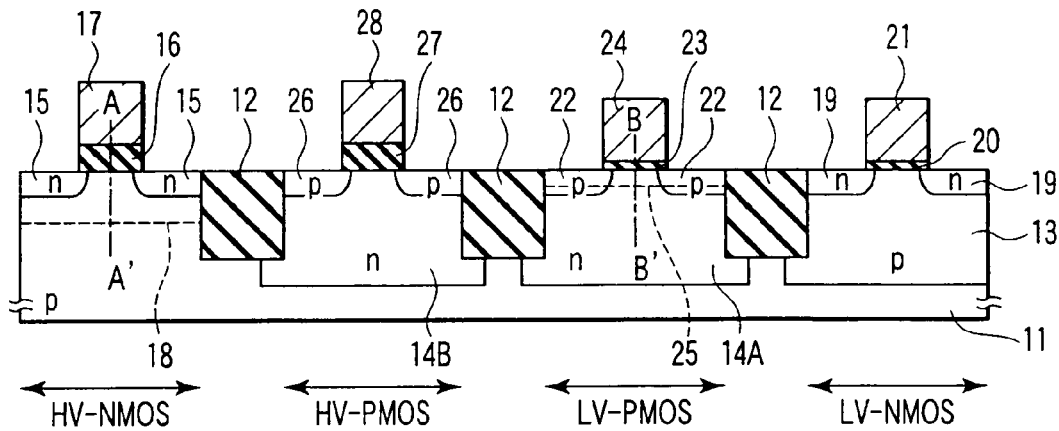
FIG. 1 is a cross-sectional view showing a semiconductor device as a reference example.

FIG. 1 shows a semiconductor device as a reference example.

An element isolation insulating layer 12 of shallow trench isolation (STI) structure is formed in a p-type semiconductor substrate 11. The semiconductor substrate 11 surrounded by the element isolation insulating layer 12 becomes an active region. A p-type well region 13 and n-type well regions 14A, 14B are formed at part of the active region.

An n-channel high-voltage transistor HV-NMOS is formed in the semiconductor substrate 11. The high-voltage transistor HV-NMOS has a source/drain diffusion layer 15, a gate oxide layer 16 and a gate electrode 17.

Figure 2:
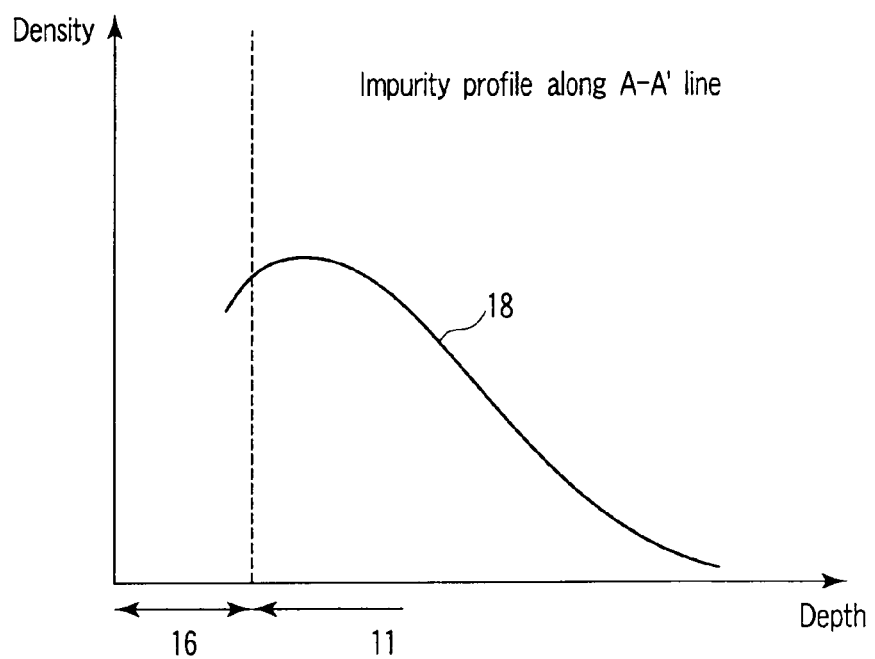
FIG. 2 is a view showing an impurity profile along line A-A' of FIG. 1.

An impurity region 18 is a region where a channel implantation is implanted to control the threshold voltage of the high-voltage transistor HV-NMOS. A profile of the impurity (for instance, boron) along line A-A', for instance, as shown in FIG. 2, becomes a gradual curve with a low peak of density value.

An n-channel low-voltage transistor LV-NMOS is formed in the p-type well region 13. The low-voltage transistor LV-NMOS has a source/drain diffusion layer 19, a gate oxide layer 20 and a gate electrode 21. The gate oxide layer 20 is thinner than the gate oxide layer 16.

A p-channel low-voltage transistor LV-PMOS is formed in the n-type well region 14A. The low-voltage transistor LV-PMOS has a source/drain diffusion layer 22, a gate oxide layer 23 and a gate electrode 24.

Figure 3:
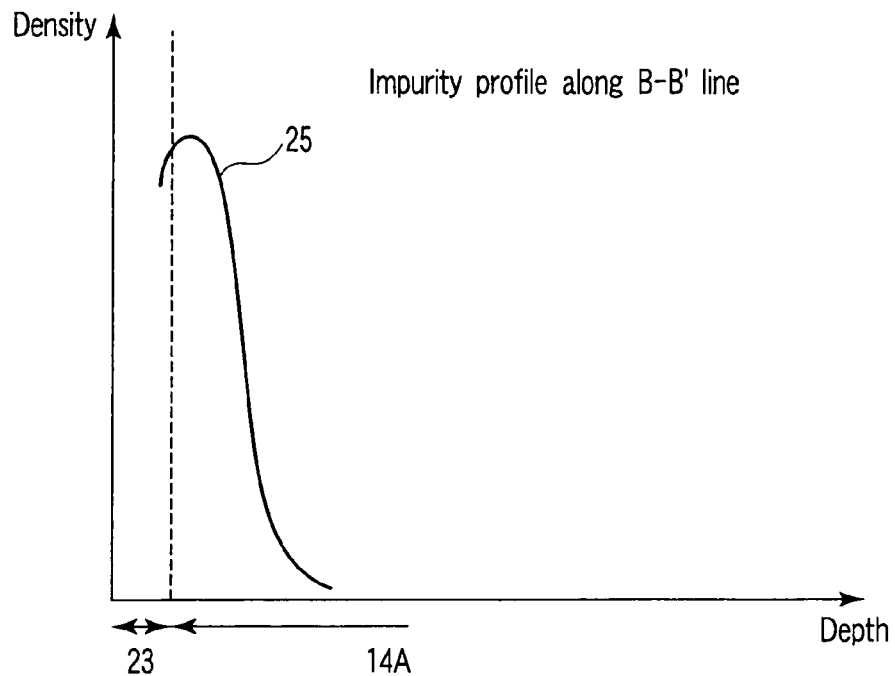
FIG. 3 is a view showing an impurity profile along line B-B' of FIG. 1.

An impurity region 25 is a region where a channel implantation is implanted to control a threshold voltage of the low-voltage transistor LV-PMOS. A profile of the impurity (for instance, boron) along line B-B', for instance, as shown in FIG. 3, becomes a sharp curve with a high peak of density value.

Further, a p-channel high-voltage transistor HV-PMOS is formed in the n-type well region 14B. The high-voltage transistor HV-PMOS has a source/drain diffusion layer 26, a gate oxide layer 27 and a gate electrode 28. The gate oxide layer 27 is thicker than the gate oxide layer 23.

(2) Process

There will be described a method of manufacturing the semiconductor device of FIG. 1.

Figure 4:
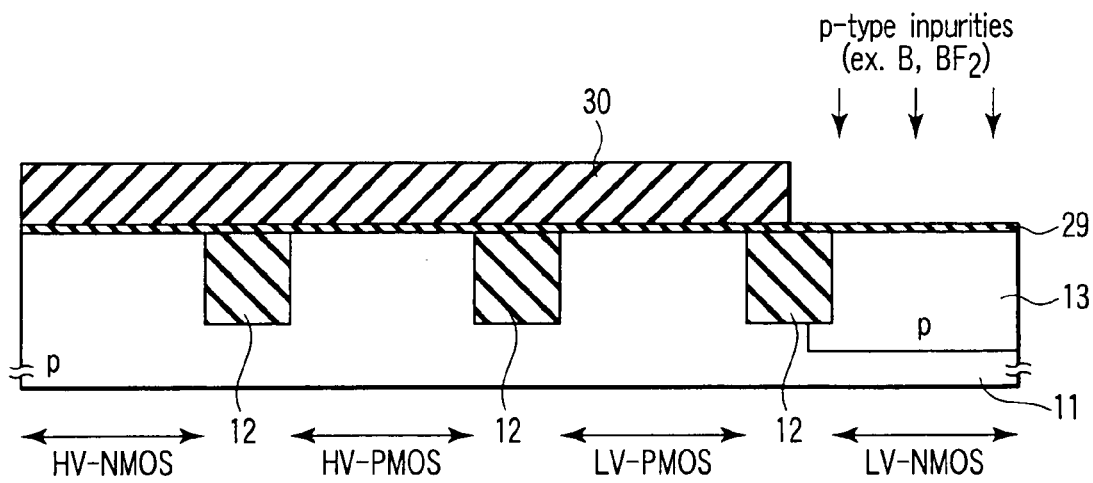
FIG. 4 is a cross-sectional view showing one process of a method of manufacturing a semiconductor device of FIG. 1.

First, as shown in FIG. 4, after forming the element isolation insulating layer 12 of the STI structure in the p-type semiconductor substrate 11, a sacrifice oxide layer 29 is formed on the semiconductor substrate 11 by a thermal oxidation method. Further, a resist pattern 30 is formed on the sacrifice oxide layer 29 by a photolithography.

Here, the sacrifice oxide layer 29 is formed for the purpose of preventing contamination of the semiconductor substrate 11 caused by the resist, and preventing peeling of the resist and the like.

Then, with the resist pattern 30 as a mask, a p-type well region 13 is formed while implanting ion implantation of p-type impurities (for instance, B, $BF_2$) with, for instance, dose amount $1 \times 10^{12}$ to $1 \times 10^{14}$ cm$^{-2}$ inside the semiconductor substrate 11. After that, the resist pattern 30 is removed.

Figure 5:
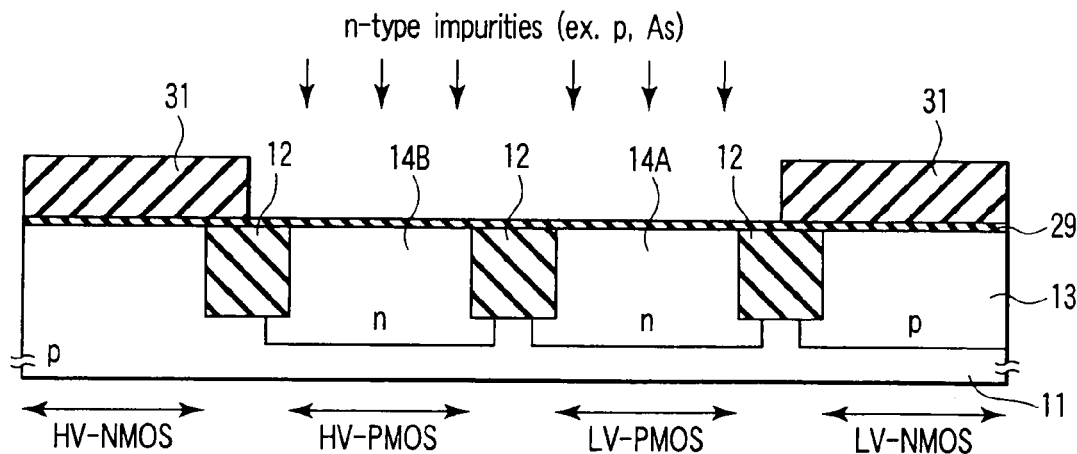
FIG. 5 is a cross-sectional view showing one process of a method of manufacturing the semiconductor device of FIG. 1.

Next, as shown in FIG. 5, a resist pattern 31 is formed again on the sacrifice oxide layer 29 by the photolithography. Then, n-type well regions 14A, 14B are formed by implanting ion implantation of n-type impurities (for instance, P, As) with, for instance, dose amount $1 \times 10^{12}$ to $1 \times 10^{14}$ cm$^{-2}$ inside the semiconductor substrate 11 with the resist pattern 31 as the mask. After that, the resist pattern 31 is removed.

By the way, about formation of the p-type well region 13 and formation of the n-type well regions 14A, 14B, it is possible for the formation order to be switched.

Figure 6:
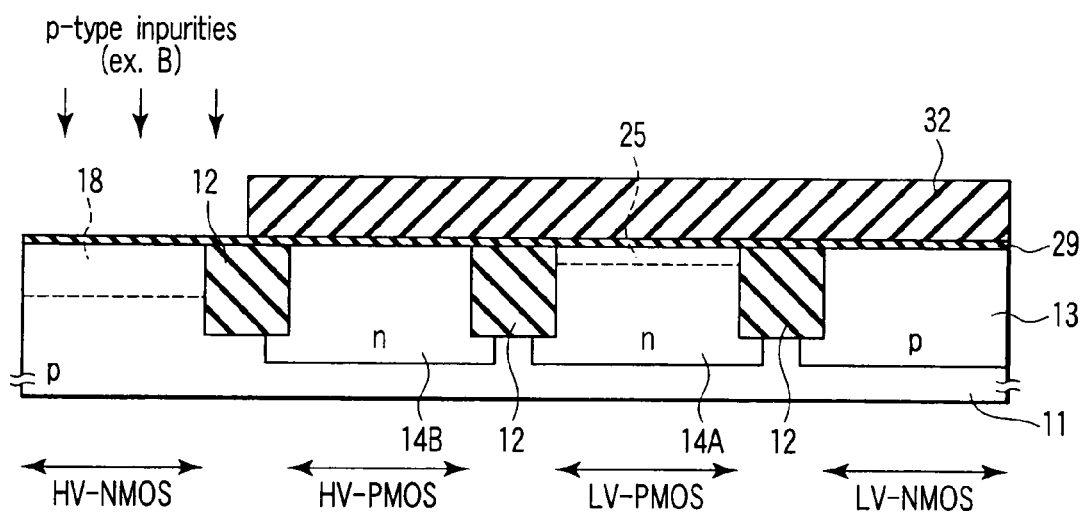
FIG. 6 is a cross-sectional view showing one process of a method of manufacturing the semiconductor device of FIG. 1.

Next, as shown in FIG. 6, the first channel implantation is implanted.

The channel implantation of the first time is implanted to a region where the n-channel high-voltage transistor HV-NMOS is formed.

First, a resist pattern 32 is formed on the sacrifice oxide layer 29 in the semiconductor substrate 11 by the photolithography (the first-time photolithography), and, with the resist pattern 32 as the mask, ion implantation of p-type impurities (for instance, B) is implanted with, for instance, dose amount $1 \times 10^{11}$ to $1 \times 10^{13}$ cm$^{-2}$, acceleration voltage 30 to 150 keV for forming an impurity region 18. After that, the resist pattern 32 is removed.

Figure 7:
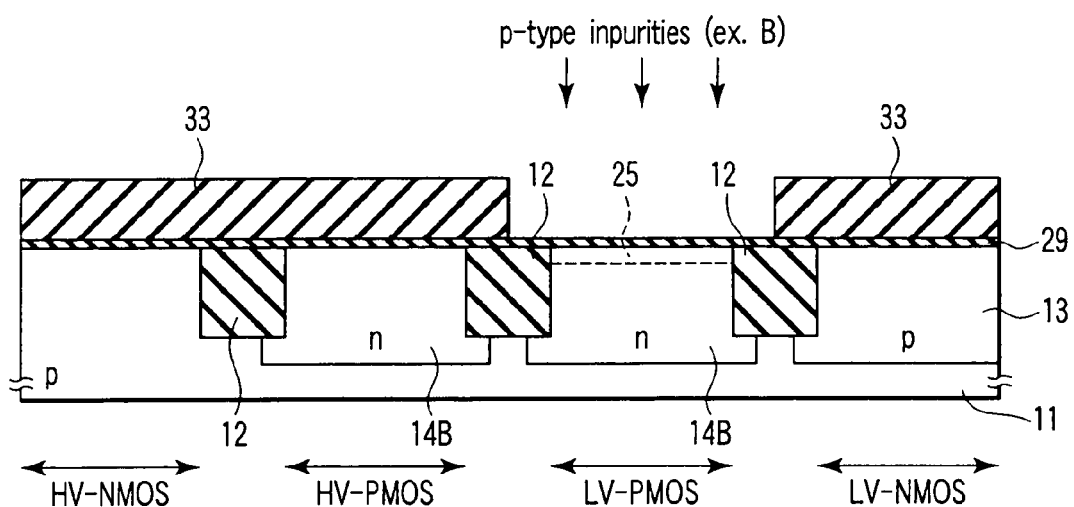
FIG. 7 is a cross-sectional view showing one process of a method of manufacturing the semiconductor device of FIG. 1.

Next, as shown in FIG. 7, the second-time channel implantation is implanted.

The second-time channel implantation is implanted to a region where the p-channel low-voltage transistor LV-PMOS is formed.

First, a resist pattern 33 is formed on the sacrifice oxide layer 29 in the semiconductor substrate 11 by the photolithography (the second-time photolithography), and, with the resist pattern 33 as the mask, ion implantation of p-type impurities (for instance, B) is implanted with, for instance, dose amount $1 \times 10^{12}$ to $1 \times 10^{14}$ cm$^{-2}$, acceleration voltage 12 to 50 keV, for forming an impurity region 25. After that, the resist pattern 33 is removed.

After that, performed is an annealing with temperature of 800 to 1200° C. for activation of the impurity regions 18, 25 with the channel implantation implanted. Further, the sacrifice oxide layer 29 is removed.

Here, the dose amount of the second-time channel implantation is larger than that of the first-time channel implantation, and the acceleration voltage is smaller than that of the first-time channel implantation.

As a result, the profile of the p-type impurities of the impurity region 18 becomes that shown in FIG. 2, while the profile of the p-type impurities of the impurity region 25 becomes that shown in FIG. 3.

By the way, about the first-time channel implantation and the second-time channel implantation, it is possible for its order to be switched.

Figure 8:
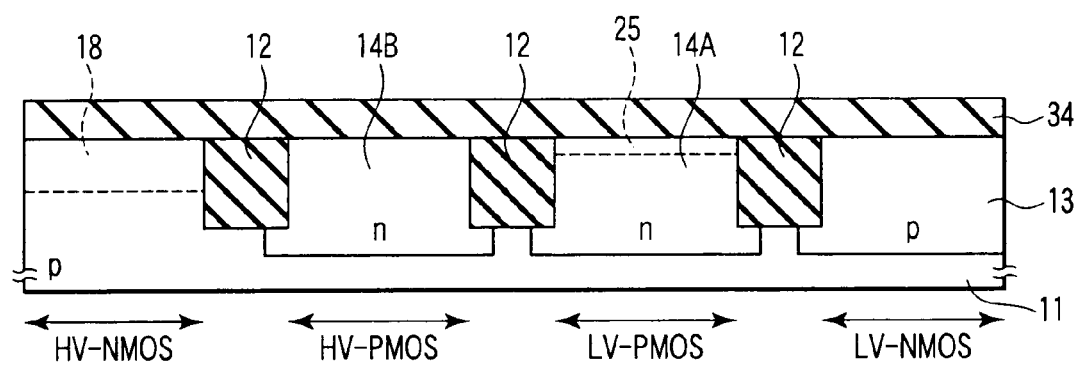
FIG. 8 is a cross-sectional view showing one process of a method of manufacturing the semiconductor device of FIG. 1.

Next, as shown in FIG. 8, a thick gate oxide layer 34 is formed for the high-voltage transistors HV-NMOS, HV-PMOS on the semiconductor substrate 11 with the thermal oxidation method. The thickness of the gate oxide layer 34 is made to be 20 to 80 nm so as to be able to withstand high voltage.

Figure 9:
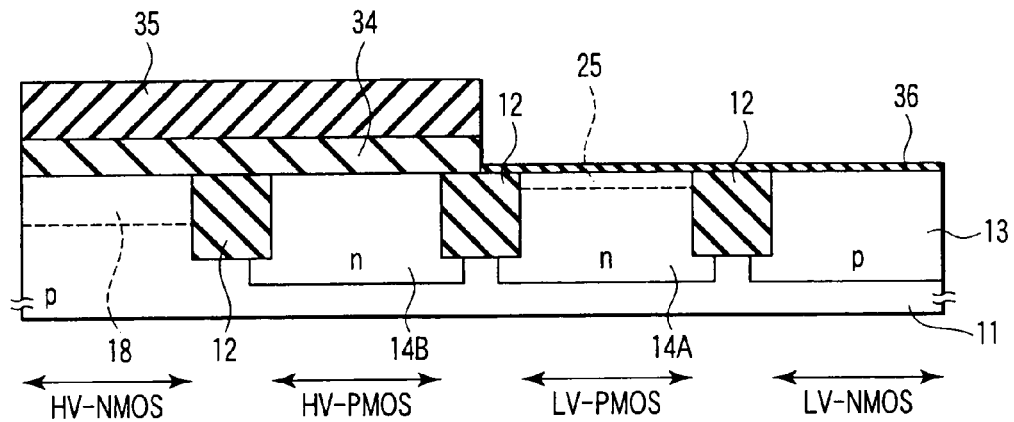
FIG. 9 is a cross-sectional view showing one process of a method of manufacturing the semiconductor device of FIG. 1.

Next, as shown in FIG. 9, a mask material (hard mask) 35 is formed on the gate oxide layer 34. The mask material 35 covers the region where the high-voltage transistors HV-NMOS, HV-PMOS are formed.

Then, with the mask material 35 as the mask, the thick gate oxide layer 34 which exists on the region where the low-voltage transistors LV-PMOS, LV-NMOS are formed is removed by reactive ion etching (RIE).

Continuously, a thin gate oxide layer 36 for the low-voltage transistors LV-PMOS, LV-NMOS is formed on the semiconductor substrate 11 by the thermal oxidation method. The thickness of the gate oxide layer 36 is made to be 5 to 14 nm. After that, the mask material 35 is removed.

Figure 10:
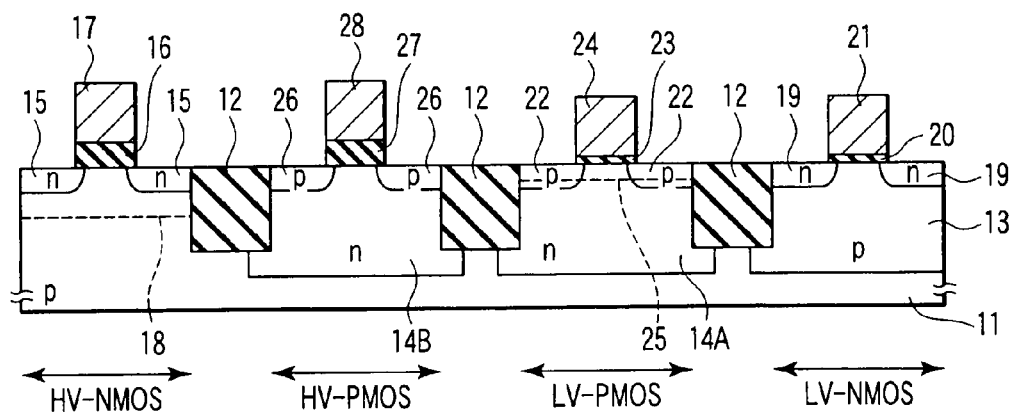
FIG. 10 is a cross-sectional view showing one process of a method of manufacturing the semiconductor device of FIG. 1.

Next, as shown in FIG. 10, a polysilicon layer is formed, gate electrodes 17, 21, 24 and 28 are formed by processing the polysilicon layer, and gate oxide layers 16, 20, 23 and 27 are formed immediately below the gate electrodes 17, 21, 24 and 28.

After that, a resist pattern for covering the p-channel high-voltage transistor HV-PMOS and the p-channel low-voltage transistor LV-PMOS is formed, and ion implantation of n-type impurities is implanted to the n-channel high-voltage transistor HV-NMOS and n-channel low-voltage transistor LV-NMOS in a self-alignment manner, with the gate electrodes 17, 21 as the mask, thereby forming source/drain diffusion layers 15, 19.

Further, a resist pattern for covering the n-channel high-voltage transistor HV-NMOS and the n-channel low-voltage transistor LV-NMOS is formed, and ion implantation of p-type impurities is implanted to the p-channel high-voltage transistor HV-PMOS and p-channel low-voltage transistor LV-PMOS in a self-alignment manner, with the gate electrodes 24, 28 as the mask, thereby forming source/drain diffusion layers 22, 26.

The semiconductor device of FIG. 1 is completed due to the above process.

(3) Consideration

In the structure and the process of the reference example, after implanting the channel implantation, the high temperature heat treatment is implanted for forming the gate oxide layer of the high-voltage transistor.

In this case, particularly, in the p-channel low-voltage transistor LV-PMOS, as shown in FIG. 8, the impurities (for instance, boron) in the impurity region (channel region) 25 is sucked in the gate oxide layer 34 by the high temperature heat treatment, and as a result, variations in the impurity density on a surface of the channel region occur.

The variations of this impurity density become cause of variations of the threshold voltage. Therefore, it causes the characteristic of the p-channel low-voltage transistor LV-PMOS to deteriorate. It is conceivable for such phenomena to be produced similarly in the n-channel high-voltage transistor HV-NMOS.

Further, particularly, heat diffusion of the impurities (for instance, boron) in the impurity region (channel region) 25 of the p-channel low-voltage transistor LV-PMOS is produced by the high temperature heat treatment for forming the gate oxide layer, so that it becomes difficult to form shallow connection in the channel region. As a result, the channel region of the p-channel low-voltage transistor LV-PMOS becomes deep, and thus the short channel effect deteriorates.

When these phenomena occur, as a result, problems such as variations of current driving force of transistors formed in the semiconductor device, variations of cutoff current and the like occur. Further, suction of the impurities of the channel region causes deterioration of performance such as decrease of withstanding voltage of the transistor, and as a result, reliability deteriorates.

Further, problems on the circuit operation in which an integrated circuit is not operated due to performance deterioration of the transistor occur.

Furthermore, in the process of the reference example, when the channel implantation is implanted to all the transistors, at least two photolithography instances are necessitated. Therefore, manufacturing process becomes complicated, and manufacturing cost increases.

3. Embodiments

Hereinafter, there will be described embodiments according to examples of the present invention.

(1) First Embodiment

A. Structure

Figure 11:
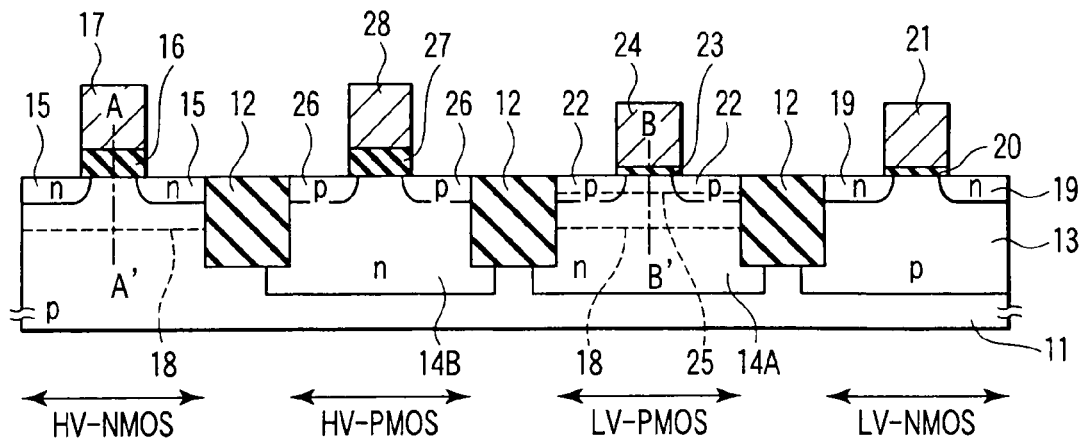
FIG. 11 is a cross-sectional view showing a semiconductor device of a first embodiment.

FIG. 11 shows a semiconductor device as a first embodiment.

An element isolation insulating layer 12 of STI structure is formed in a p-type semiconductor substrate 11. The semiconductor substrate 11 surrounded by the element isolation insulating layer 12 becomes an active area. A p-type well region 13 and n-type well regions 14A, 14B are formed in part of the active area.

An n-channel high-voltage transistor HV-NMOS is formed in the semiconductor substrate 11. The high-voltage transistor HV-NMOS has a source/drain diffusion layer 15, a gate oxide layer 16 and a gate electrode 17.

An impurity region 18 is a region where a channel implantation is implanted for controlling a threshold voltage of the high-voltage transistor HV-NMOS. The channel implantation to the high-voltage transistor HV-NMOS is implanted using, for instance, p-type impurities (for instance, boron).

Figure 12:
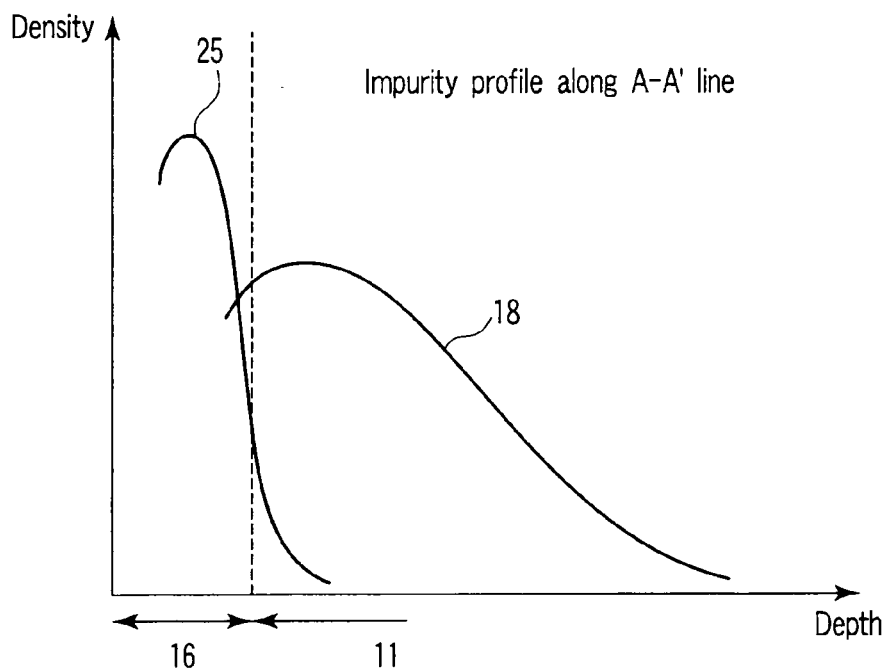
FIG. 12 is a view showing an impurity profile along line A-A' of FIG. 11.

Here, one of peaks of p-type impurity profile along line A-A', for instance, as shown in FIG. 12, exists in the gate oxide layer 16.

An n-channel low-voltage transistor LV-NMOS is formed in the p-type well region 13. The low-voltage transistor LV-NMOS has a source/drain diffusion layer 19, a gate oxide layer 20 and a gate electrode 21. The gate oxide layer 20 is thinner than the gate oxide layer 16.

A p-channel low-voltage transistor LV-PMOS is formed in the n-type well region 14A. The low-voltage transistor LV-PMOS has a source/drain diffusion layer 22, a gate oxide layer 23 and a gate electrode 24.

An impurity region 25 is a region where channel implantation is implanted to control a threshold voltage of the low-voltage transistor LV-PMOS. The channel implantation to the low-voltage transistor LV-PMOS is implanted using, for instance, p-type impurities (for instance, boron).

Figure 13:
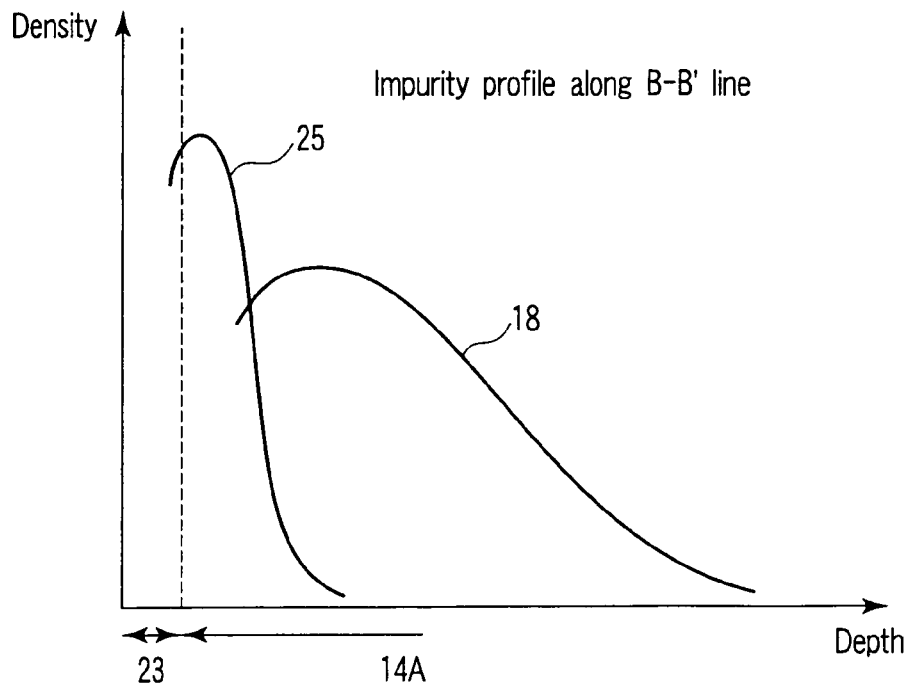
FIG. 13 is a view showing an impurity profile along line B-B' of FIG. 11.

Here, the profile of the p-type impurities along line B-B', for instance, as shown in FIG. 13, has peaks based on the impurity regions 18, 25.

Further, a p-channel high-voltage transistor HV-PMOS is formed in the n-type well region 14B. The high-voltage transistor HV-PMOS has a source/drain diffusion layer 26, a gate oxide layer 27 and a gate electrode 28. The gate oxide layer 27 is thicker than the gate oxide layer 23.

B. Process

There will be described a method of manufacturing a semiconductor device of FIG. 11.

Figure 14:
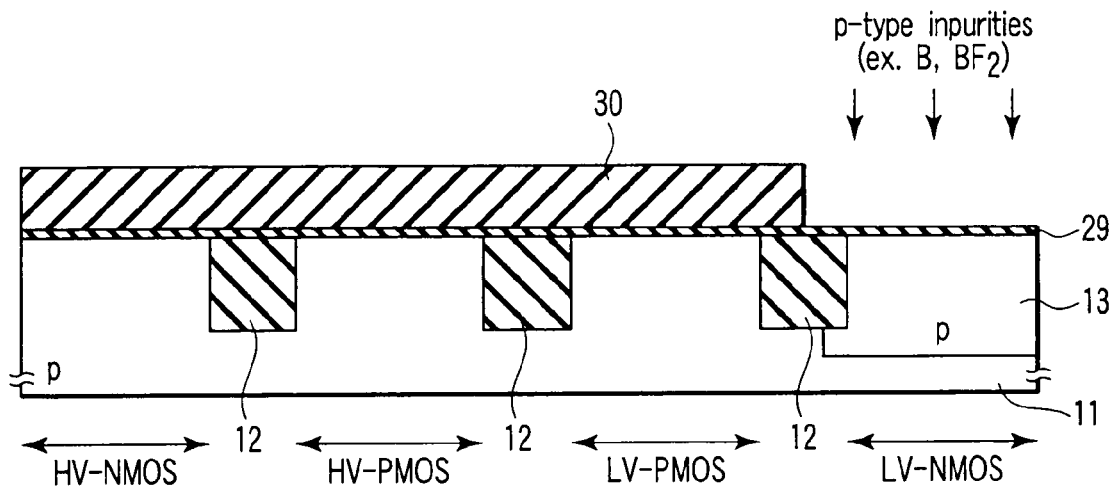
FIG. 14 is a cross-sectional view showing one process of a method of manufacturing the semiconductor device of FIG. 11.

First, as shown in FIG. 14, after forming the element isolation insulating layer 12 of STI structure in the p-type semiconductor substrate 11, a sacrifice oxide layer 29 is formed on the semiconductor substrate 11 by a thermal oxidation method. Further, a resist pattern 30 is formed on the sacrifice oxide layer 29 by a photolithography.

Here, the sacrifice oxide layer 29, as described in the reference example, is formed for the purpose of preventing contamination of semiconductor substrate 11 caused by a resist, prevention of resist peeling, or the like. Thickness of the sacrifice oxide layer 29 is made to be 2 to 20 nm.

Then, with the resist pattern 30 as a mask, the p-type well region 13 is formed while implanting ion implantation of the p-type impurities (for instance, B, $BF_2$) with, for instance, dose amount $1 \times 10^{12}$ to $1 \times 10^{14}$ cm$^{-2}$ inside the semiconductor substrate 11. After that, the resist pattern 30 is removed by ashing or sulfuric acid hydrogen peroxide mixed chemicals.

Next, as shown in FIG. 15, a resist pattern 31 is formed again on the sacrifice oxide layer 29 by the photolithography. Then, with the resist pattern 31 as the mask, the n-type well regions 14A, 14B are formed while implanting ion implantation of the n-type impurities (for instance, P, As) with, for instance, dose amount $1\times10^{12}$ to $1\times10^{14}$ cm$^{-2}$ inside the semiconductor substrate 11. After that, the resist pattern 31 is removed by ashing or sulfuric acid hydrogen peroxide mixed chemicals.

After that, performed is annealing of temperature of 800 to 1200° C. for activation of the p-type well region 13 and the n-type well regions 14A, 14B. Further, the sacrifice oxide layer 29 is removed.

By the way, about formation of the p-type well region 13 and formation of the n-type well regions 14A, 14B, it is possible for the formation order to be switched.

Next, as shown in FIG. 16, a thick gate oxide layer 34 is formed for the high-voltage transistors HV-NMOS, HV-PMOS on the semiconductor substrate 11 by a thermal oxidation method or a CVD method. The thickness of the gate oxide layer 34 is made to be 20 to 80 nm so as to be able to withstand high voltage.

In such a way as above, before implanting the channel implantation, the thick gate oxide layer 34 for the high-voltage transistors HV-NMOS, HV-PMOS is formed, thereby it is possible to prevent variations of the threshold voltage caused by suction of the channel implanted impurities, and it is possible to improve the short channel effect caused by impurity diffusion.

Next, as shown in FIG. 17, a mask material (hard mask) 35 made of, for instance, silicon nitride is formed on the gate oxide layer 34 by the photolithography. The mask material 35 covers the region where the high-voltage transistors HV-NMOS, HV-PMOS are formed.

Then, with the mask material 35 as the mask, the thick gate oxide layer 34 existing on the region where the low-voltage transistors LV-PMOS, LV-NMOS are formed is removed by RIE or liquid chemical.

Continuously, a sacrifice oxide layer 36' is formed on the region where the low-voltage transistors LV-PMOS, LV-NMOS are formed by sulfuric acid hydro-treatment or ozone treatment. The thickness of the sacrifice oxide layer 36' is made to be 0.5 to 5 nm. The object of the sacrifice oxide layer 36' is the same as that of the sacrifice oxide layer 29. After that, the mask material 35 is removed.

Figure 18:
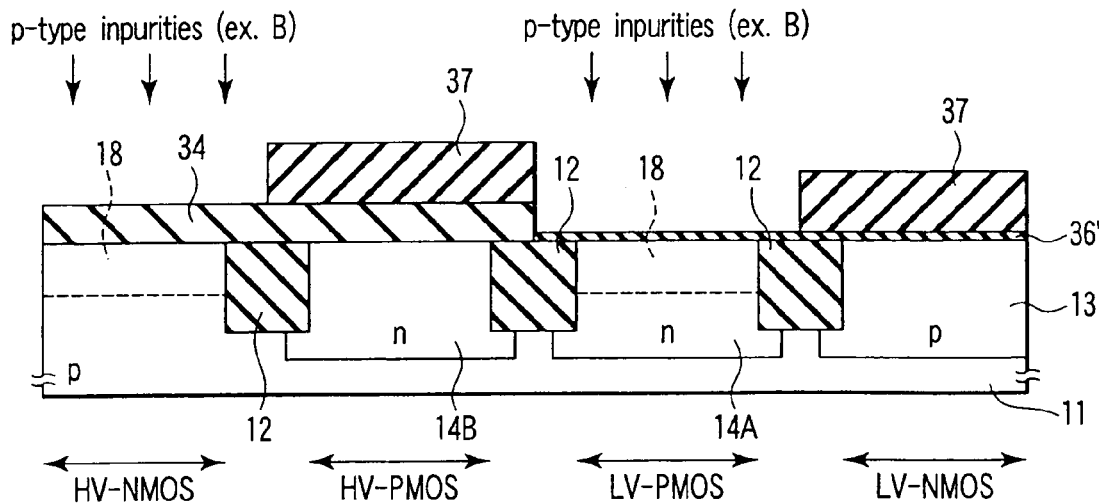
FIG. 18 is a cross-sectional view showing one process of a method of manufacturing the semiconductor device of FIG. 11.

Next, as shown in FIG. 18, the first-time channel implantation is implanted.

The first-time channel implantation is implanted for the threshold control of the n-channel high-voltage transistor HV-NMOS.

First, a resist pattern 37 is formed on the gate oxide layer 34 and the sacrifice oxide layer 36' by the photolithography, with the resist pattern 37 as the mask, the impurity region 18 is formed while implanting the ion implantation of the p-type impurities (for instance, B) with, for instance, dose amount $1\times10^{11}$ to $1\times10^{13}$ cm$^{-2}$, and acceleration voltage of 12 to 150 keV.

Here, the process is different from the reference example in that the first-time channel implantation to the high-voltage transistor HV-NMOS is also implanted to the p-channel low-voltage transistor LV-PMOS.

Therefore, the impurity region 18 by the first-time channel implantation is formed in the semiconductor substrate 11 where the high-voltage transistor HV-NMOS is formed, and in the n-type well region 14A where the low-voltage transistor LV-PMOS is formed respectively.

Although the impurity region 18 in the n-type well region 14A forms the peak of the p-type impurities in the n-type well region 14A, the peak value (density value) is smaller than a peak value of the p-type impurities due to the second-time channel implantation described later by one figure or more, therefore, it does not become a large problem when controlling the threshold voltage.

Figure 19:
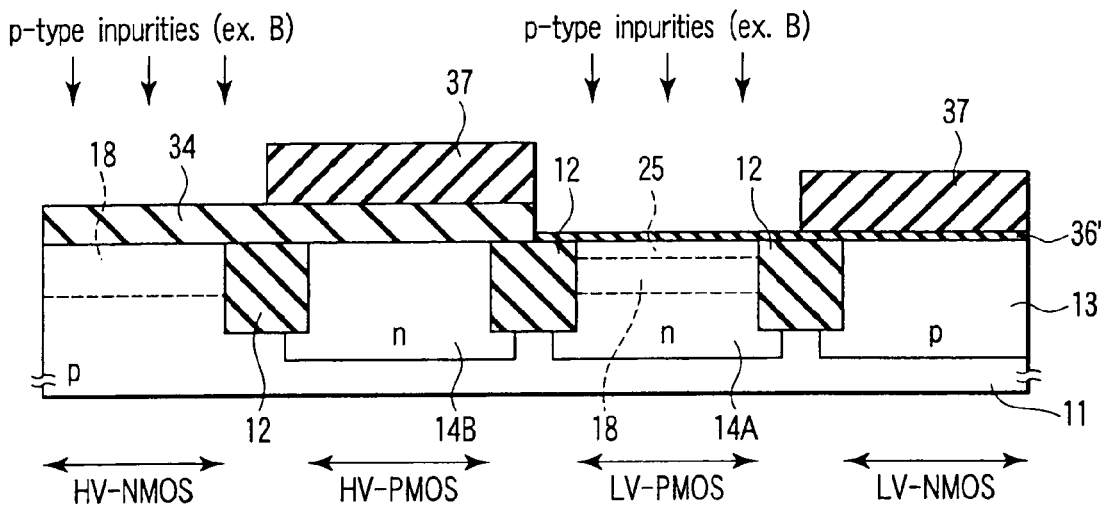
FIG. 19 is a cross-sectional view showing one process of a method of manufacturing the semiconductor device of FIG. 11.

Next, as shown in FIG. 19, the second-time channel implantation is implanted.

The second-time channel implantation is implanted for the threshold control of the p-channel low-voltage transistor LV-PMOS.

The second-time channel implantation is implanted by using the mask material used in the first-time channel implantation, that is, by using the resist pattern 37 as it is. For this reason, compared with the reference example, the number of photolithography process instances decreases by one, and thus it contributes to simplification of the manufacturing process and decrease of the manufacturing cost.

The second-time channel implantation, with the resist pattern 37 as the mask, is implanted while implanting the ion implantation of the p-type impurities (for instance, B) with, for instance, dose amount $1\times10^{12}$ to $1\times10^{14}$ cm$^{-2}$, and acceleration voltage of 1 to 10 keV. As a result, an impurity region 25 is formed in the n-type well region 14A where the low-voltage transistor LV-PMOS is formed.

Therefore, the peak of the p-type impurity profile in the n-type well region 14A where the low-voltage transistor LV-PMOS is formed becomes two peaks one of which is based on the impurity region 18, while the other one is based on the impurity region 25.

Further, the second-time channel implantation to the low-voltage transistor LV-PMOS is also implanted to the n-channel high-voltage transistor HV-NMOS.

However, the second-time channel implantation is such that the acceleration voltage is set to 1 to 10 keV and the gate oxide layer 34 of the high-voltage transistor HV-NMOS is sufficiently thick, and thus the peak of the p-type impurity profile exists in the gate oxide layer 34, and it is possible to suppress influence affecting the threshold voltage of the high-voltage transistor HV-NMOS.

Thus, in the present example, the first-time channel implantation and the second-time channel implantation are implanted respectively to both the region where the high-voltage transistor HV-NMOS is formed and the region where the low-voltage transistor LV-PMOS is formed, while using the same mask. However, the threshold voltage of the both transistors is capable of being controlled independently by utilizing density difference of the impurity regions 18, 25 and the thickness of the gate oxide layer 34.

Additionally, in order that the peak value (density value) of the profile of the impurity region 25 is made larger than that of the profile of the impurity region 18, a dose amount of the second-time channel implantation is made larger than that of the first-time channel implantation.

Further, about the first-time channel implantation and the second-time channel implantation, it is possible for their formation order to be switched.

After that, the resist pattern 37 is removed by ashing or sulfuric acid hydrogen peroxide mixed chemicals.

Further, performed is an annealing with temperature of 800 to 1200° C. for activation of the impurity regions 18, 25 with the channel implantation implanted.

Furthermore, the sacrifice oxide layer 36' is removed using a diluted fluoric acid or an ammonium fluoride aqueous solution. At this time, etching condition of the sacrifice oxide layer 36' is controlled such that the gate oxide layer 34 of the high-voltage transistors HV-NMOS, HV-PMOS is not etched largely.

Figure 20:
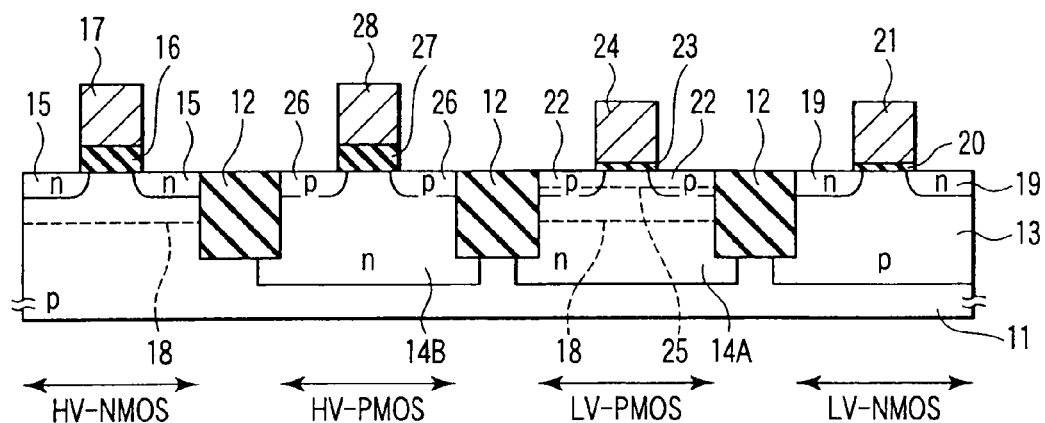
FIG. 20 is a cross-sectional view showing one process of a method of manufacturing the semiconductor device of FIG. 11.

Next, as shown in FIG. 20, thin gate oxide layers 20, 23 are formed respectively on the p-type well region 13 where the low-voltage transistor LV-NMOS is formed and on the n-type well region 14 where the low-voltage transistor LV-PMOS is formed by the thermal oxidation method or the CVD method.

Further, polysilicon layer is formed, gate electrodes 17, 21, 24 and 28 are formed by processing the polysilicon layers, and gate oxide layers 16, 20, 23 and 27 are formed immediately below the gate electrodes 17, 21, 24 and 28.

Here, the thickness of the gate oxide layers 20, 23 is made to be 5 to 14 nm, so that it is made approximately ⅓ or less of the thickness of the gate oxide layers 16, 27.

After that, a resist pattern for covering the p-channel high-voltage transistor HV-PMOS and the p-channel low-voltage transistor LV-PMOS is formed, and the ion implantation of n-type impurities is implanted to the n-channel high-voltage transistor HV-NMOS and n-channel low-voltage transistor LV-NMOS in a self-alignment manner, with the gate electrodes 17, 21 as the mask, thereby forming source/drain diffusion layers 15, 19.

Further, a resist pattern for covering the n-channel high-voltage transistor HV-NMOS and the n-channel low-voltage transistor LV-NMOS is formed, and the ion implantation of p-type impurities is implanted to the p-channel high-voltage transistor HV-PMOS and p-channel low-voltage transistor LV-PMOS in a self-alignment manner, with the gate electrodes 24, 28 as the mask, thereby forming source/drain diffusion layers 22, 26.

By the above process, the semiconductor device of FIG. 11 is completed.

C. Summary

According to the structure and process of the first embodiment, before implanting the channel implantation, the gate oxide layer of the high-voltage transistor is formed.

For this reason, particularly, in the p-channel low-voltage transistor LV-PMOS, suction of the impurities (for instance, boron) and heat diffusion in the channel region are hard to occur, and thus it is possible to realize prevention of the threshold voltage variations and improvement of the short channel effect.

Further, together with this, it is possible to prevent variations of the current driving force and variations of cutoff current of transistors formed in the semiconductor device, and thus it is possible to achieve improvement of performance and reliability of the transistor.

Furthermore, in the process of the first embodiment, since the channel implantation is implanted while using the same mask to all the transistors, the number of photolithography process instances can be decreased by one compared with the reference example, and thus it is possible to realize decrease of the manufacturing cost due to simplification of the manufacturing process.

Incidentally, even though the same mask is used, it is possible for all the transistors to control the threshold voltage independently by utilizing the peak value (density value) of the impurity profile based on the channel implantation and the thickness of the gate oxide layer of the high-voltage transistor HV-NMOS.

(2) Second Embodiment

A second embodiment relates to a modified example of the first embodiment.

A. Structure

Figure 21:
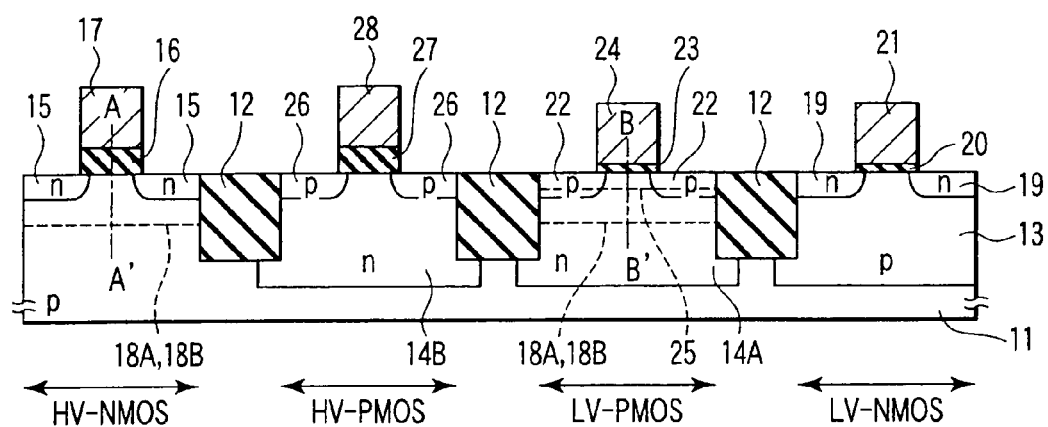
FIG. 21 is a cross-sectional view showing a semiconductor device of a second embodiment.

FIG. 21 shows a semiconductor device as the second embodiment.

An element isolation insulating layer 12 of STI structure is formed in a p-type semiconductor substrate 11. The semiconductor substrate 11 surrounded by the element isolation insulating layer 12 becomes an active area. A p-type well region 13 and n-type well regions 14A, 14B are formed in part of the active area.

An n-channel high-voltage transistor HV-NMOS is formed in the semiconductor substrate 11. The high-voltage transistor HV-NMOS has a source/drain diffusion layer 15, a gate oxide layer 16 and a gate electrode 17.

Impurity regions 18A, 18B are regions where a channel implantation is implanted for controlling a threshold voltage of the high-voltage transistor HV-NMOS. The channel implantation to the high-voltage transistor HV-NMOS is implanted using, for instance, p-type impurities (for instance, boron).

Figure 22:
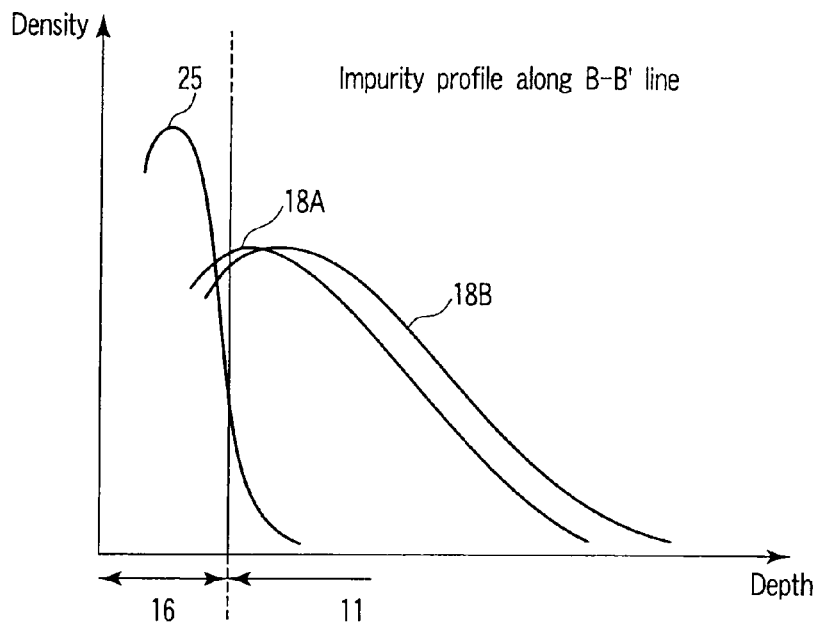
FIG. 22 is a view showing an impurity profile along line A-A' of FIG. 21.

Here, one of peaks of p-type impurity profile along line A-A', for instance, as shown in FIG. 22, exists in the gate oxide layer 16.

An n-channel low-voltage transistor LV-NMOS is formed in the p-type well region 13. The low-voltage transistor LV-NMOS has a source/drain diffusion layer 19, a gate oxide layer 20 and a gate electrode 21. The gate oxide layer 20 is thinner than the gate oxide layer 16.

A p-channel low-voltage transistor LV-PMOS is formed in the n-type well region 14A. The low-voltage transistor LV-PMOS has a source/drain diffusion layer 22, a gate oxide layer 23 and a gate electrode 24.

An impurity region 25 is a region where channel implantation is implanted to control a threshold voltage of the low-voltage transistor LV-PMOS. The channel implantation to the low-voltage transistor LV-PMOS is implanted using, for instance, p-type impurities (for instance, boron).

Figure 23:
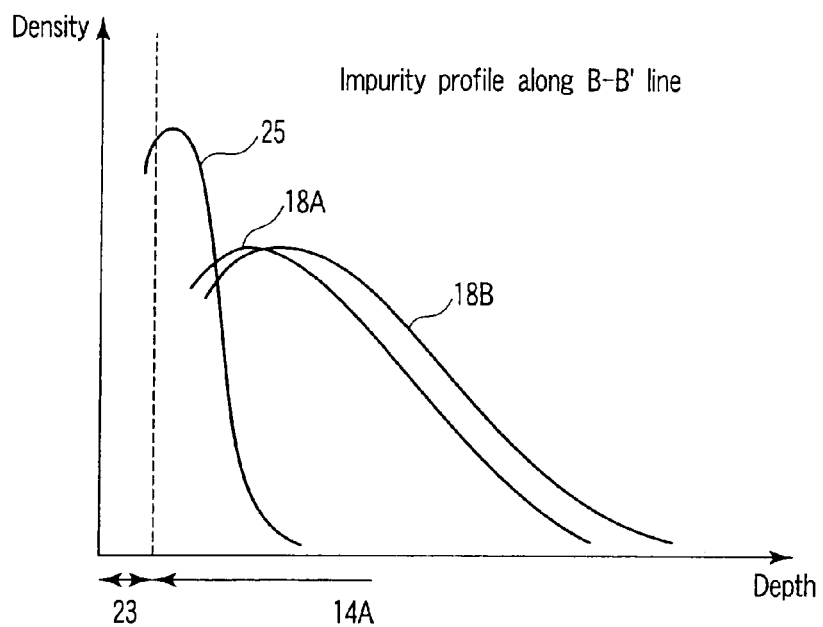
FIG. 23 is a view showing an impurity profile along line B-B' of FIG. 21.

Here, the profile of the p-type impurities along line B-B', for instance, as shown in FIG. 23, has peaks with the impurity regions 18A, 18B and 25.

Further, a p-channel high-voltage transistor HV-PMOS is formed in the n-type well region 14B. The high-voltage transistor HV-PMOS has a source/drain diffusion layer 26, a gate oxide layer 27 and a gate electrode 28. The gate oxide layer 27 is thicker than the gate oxide layer 23.

B. Process

There will be described the method of manufacturing a semiconductor device of FIG. 21.

Characteristic of the manufacturing method is that the channel implantation is implanted three times, and the other features are the same as the manufacturing method of the first embodiment.

Figure 24:
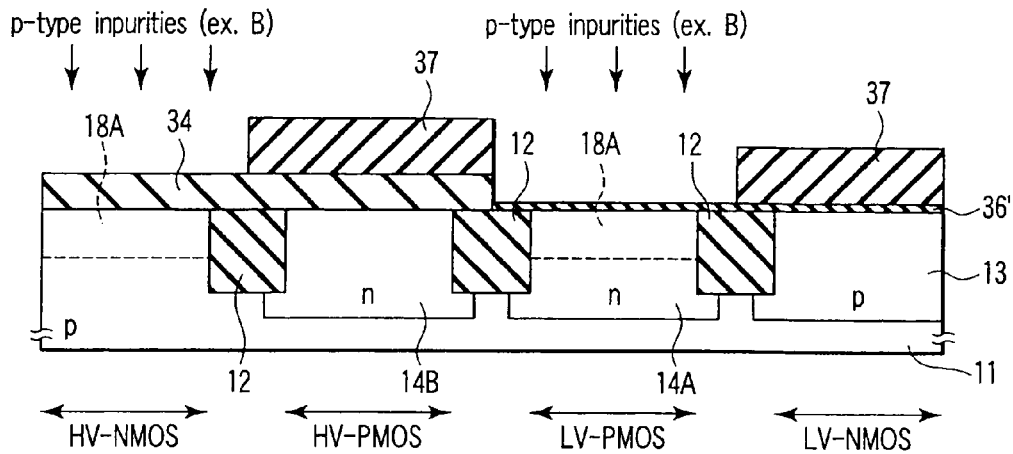
FIG. 24 is a cross-sectional view showing one process of a method of manufacturing the semiconductor device of FIG. 21.

First, as shown in FIG. 24, the process until the gate oxide layers 34 of the high-voltage transistors HV-NMOS, HV-PMOS are formed, and the sacrifice oxide layer 36' is formed on the region where the low-voltage transistors LV-PMOS, LV-NMOS are formed, is executed in accordance with the same process as the process of the above described first embodiment.

After that, the first-time channel implantation is implanted.

The first-time channel implantation is implanted for the threshold control of the n-channel high-voltage transistor HV-NMOS.

That is, a resist pattern 37 is formed on the gate oxide layer 34 and the sacrifice oxide layer 36' by the photolithography, and, with the resist pattern 37 as the mask, the impurity region 18A is formed while implanting the ion implantation of the p-type impurities (for instance, B) with, for instance, dose amount $1 \times 10^{11}$ to $1 \times 10^{13}$ cm$^{-2}$, and acceleration voltage of 30 to 150 keV.

Figure 25:
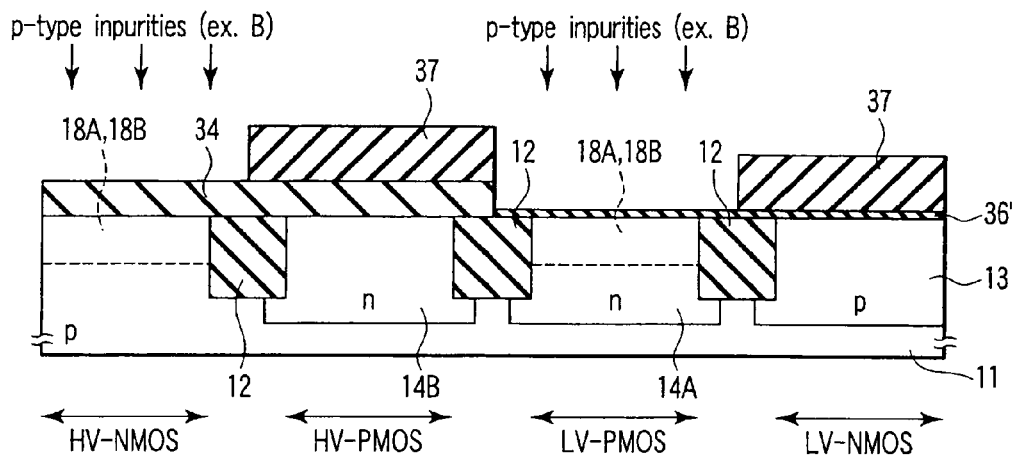
FIG. 25 is a cross-sectional view showing one process of a method of manufacturing the semiconductor device of FIG. 21.

Continuously, as shown in FIG. 25, the second-time channel implantation is implanted.

The second-time channel implantation is also implanted for the threshold control of the n-channel high-voltage transistor HV-NMOS.

That is, with the resist pattern 37 as the mask, the impurity region 18B is formed while implanting the ion implantation of the p-type impurities (for instance, B) with, for instance, dose amount $1 \times 10^{11}$ to $1 \times 10^{13}$ cm$^{-2}$, and acceleration voltage of 12 to 150 keV.

Additionally, the impurity profile based on the impurity regions 18A, 18B are independent respectively, and two peaks of the p-type impurities are formed based on this reason.

Here, like the first embodiment, the first-time and the second-time channel implantations to the high-voltage transistor HV-NMOS are also implanted to the p-channel low-voltage transistor LV-PMOS.

Therefore, the impurity regions 18A, 18B based on the first-time and the second-time channel implantations are also formed in the n-type well region 14A where the low-voltage transistor LV-PMOS is formed in addition to the semiconductor substrate 11 where the high-voltage transistor HV-NMOS is formed.

Although the impurity regions 18A, 18B in the n-type well region 14A form two peaks of the p-type impurities in the n-type well region 14A, the peak value (density value) is smaller than a peak value of the p-type impurities by the third time channel implantation described later by one figure or more. Therefore, it does not become a large problem when controlling the threshold voltage.

Figure 26:
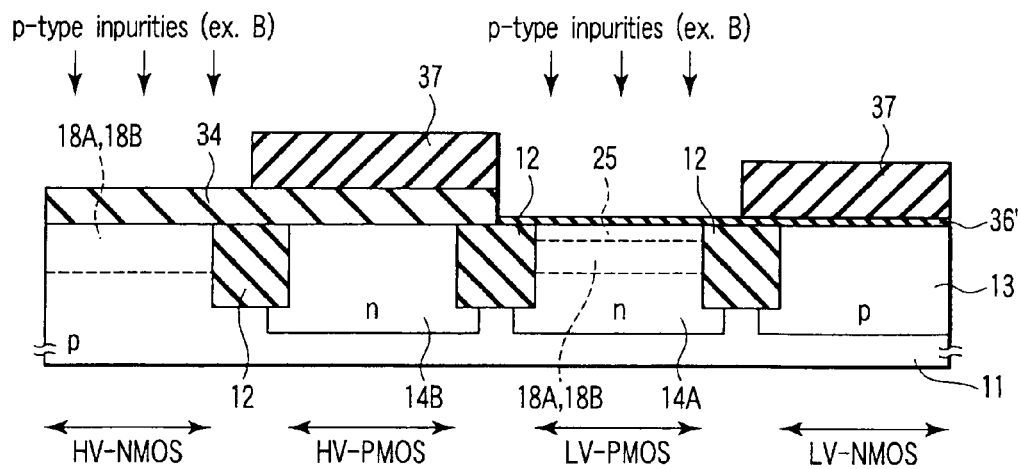
FIG. 26 is a cross-sectional view showing one process of a method of manufacturing the semiconductor device of FIG. 21.

Next, as shown in FIG. 26, the third time channel implantation is implanted.

The third time channel implantation is implanted for the threshold control of the p-channel low-voltage transistor LV-PMOS.

The third time channel implantation is executed by using the mask material used in the first-time and the second-time channel implantations, that is, by using the resist pattern 37 as it is. For this reason, compared with the reference example, the number of photolithography process instances decreases by one, and thus it contributes to simplification of the manufacturing process and decrease of the manufacturing cost.

The third time channel implantation, with the resist pattern 37 as the mask, is implanted while implanting the ion implantation of the p-type impurities (for instance, B) with, for instance, dose amount $1 \times 10^{12}$ to $1 \times 10^{14}$ cm$^{-2}$, and acceleration voltage of 1 to 10 keV. As a result, an impurity region 25 is formed in the n-type well region 14A where the low-voltage transistor LV-PMOS is formed.

Therefore, the peak of the p-type impurity profile in the n-type well region 14A where the low-voltage transistor LV-PMOS is formed becomes three peaks two of which are based on the impurity regions 18A, 18B while the other one is based on the impurity region 25.

Further, the third time channel implantation to the low-voltage transistor LV-PMOS is also implanted to the n-channel high-voltage transistor HV-NMOS.

However, the third time channel implantation is such that the acceleration voltage is set to 1 to 10 keV and the gate oxide layer 34 of the high-voltage transistor HV-NMOS is sufficiently thick, and thus the peak of the p-type impurity profile exists in the gate oxide layer 34, and it is possible to suppress influence affecting the threshold voltage of the high-voltage transistor HV-NMOS.

Thus, in the present example, the third time channel implantation is implanted to both the region where the high-voltage transistor HV-NMOS is formed and the region where the low-voltage transistor LV-PMOS is formed, while using the same mask. However, the threshold voltage of the both transistors can be controlled independently by utilizing density difference of the impurity regions 18A, 18B and 25, and the thickness of the gate oxide layer 34.

Additionally, in order that the peak value (density value) of the profile of the impurity region 25 is made larger than that of the profile of the impurity regions 18A, 18B, a dose amount of the third time channel implantation is made larger than that of the first-time and the second-time channel implantations.

Further, about the third time channel implantation, since its order is not limited particularly, it is possible for its order to be switched.

After that, the resist pattern 37 is removed by ashing or sulfuric acid hydrogen peroxide mixed chemicals.

Further, performed is an annealing with temperature of 800 to 1200° C. for activation of the impurity regions 18A, 18B and 25 with the channel implantation implanted.

Furthermore, the sacrifice oxide layer 36' is removed using a diluted fluoric acid or an ammonium fluoride aqueous solution. At this time, etching condition of the sacrifice oxide layer 36' is controlled such that the gate oxide layer 34 of the high-voltage transistors HV-NMOS, HV-PMOS is not etched largely.

After that, the semiconductor device of FIG. 21 is completed by being subjected to the same process (referring to description of FIG. 20) as the first embodiment.

C. Summary

According to the structure and process of the second embodiment, it is possible to obtain the same effect as the first embodiment. That is, it is possible to realize prevention of the threshold voltage variations and improvement of the short channel effect without the complicated manufacturing process.

Further, together with this, it is possible to prevent variations of the current driving force and variations of cutoff current of transistors formed in the semiconductor device, and thus it is possible to achieve improvement of performance and reliability of the transistor.

Incidentally, concerning the three times of the channel implantations, even though the same mask is used, it is possible for all the transistors to control the threshold voltage independently by utilizing the peak value (density value) of the impurity profile and the thickness of the gate oxide layer of the high-voltage transistor.

In the second embodiment, since control of the threshold voltage of the n-channel high-voltage transistor is executed by two times of the ion implantations, it is possible to improve controllability of the threshold voltage.

(3) Third Embodiment

A third embodiment is different from the first embodiment in that the high-voltage transistor HV-PMOS (low threshold) of a low-threshold type or a depression type is added; and the other features are the same as the first embodiment.

A. Structure

Figure 27:
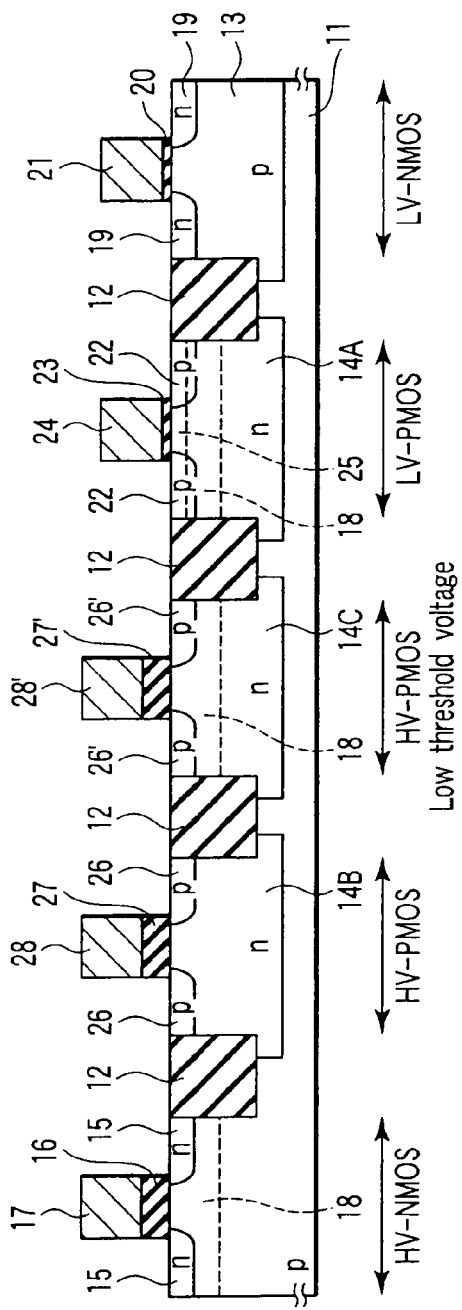
FIG. 27 is a cross-sectional view showing a semiconductor device of a third embodiment.

FIG. 27 shows the semiconductor device as the third embodiment.

An element isolation insulating layer 12 of STI structure is formed in a p-type semiconductor substrate 11. The semiconductor substrate 11 surrounded by the element isolation insulating layer 12 becomes an active area. A p-type well region 13 and n-type well regions 14A, 14B are formed in part of the active area.

An n-channel high-voltage transistor HV-NMOS is formed in the semiconductor substrate 11. The high-voltage transistor HV-NMOS has a source/drain diffusion layer 15, a gate oxide layer 16 and a gate electrode 17.

An impurity region 18 is a region where a channel implantation is implanted for controlling a threshold voltage of the high-voltage transistor HV-NMOS. The channel implantation to the high-voltage transistor HV-NMOS is implanted using, for instance, a p-type impurities (for instance, boron).

An n-channel low-voltage transistor LV-NMOS is formed in the p-type well region 13. The low-voltage transistor LV-NMOS has a source/drain diffusion layer 19, a gate oxide layer 20 and a gate electrode 21. The gate oxide layer 20 is thinner than the gate oxide layer 16.

A p-channel low-voltage transistor LV-PMOS is formed in the n-type well region 14A. The low-voltage transistor LV-PMOS has a source/drain diffusion layer 22, a gate oxide layer 23 and a gate electrode 24.

An impurity region 25 is a region where a channel implantation is implanted to control a threshold voltage of the low-voltage transistor LV-PMOS. The channel implantation to the low-voltage transistor LV-PMOS is implanted by using, for instance, the p-type impurities (for instance, boron).

The p-channel high-voltage transistor HV-PMOS is formed in the n-type well region 14B. The high-voltage transistor HV-PMOS has a source/drain diffusion layer 26, a gate oxide layer 27 and a gate electrode 28. The gate oxide layer 27 is thicker than the gate oxide layer 23.

A p-channel high-voltage transistor HV-PMOS (low threshold) is formed in an n-type well region 14C. The high-voltage transistor HV-PMOS (low threshold) is a low-threshold-type or a depression-type transistor in which the threshold voltage is set lower than the high-voltage transistor HV-PMOS.

The high-voltage transistor HV-PMOS (low threshold) has a source/drain diffusion layer 26', a gate oxide layer 27' and a gate electrode 28'. The gate oxide layer 27' is thicker than the gate oxide layer 23.

B. Process

There will be described a method of manufacturing the semiconductor device of FIG. 27.

Figure 28:
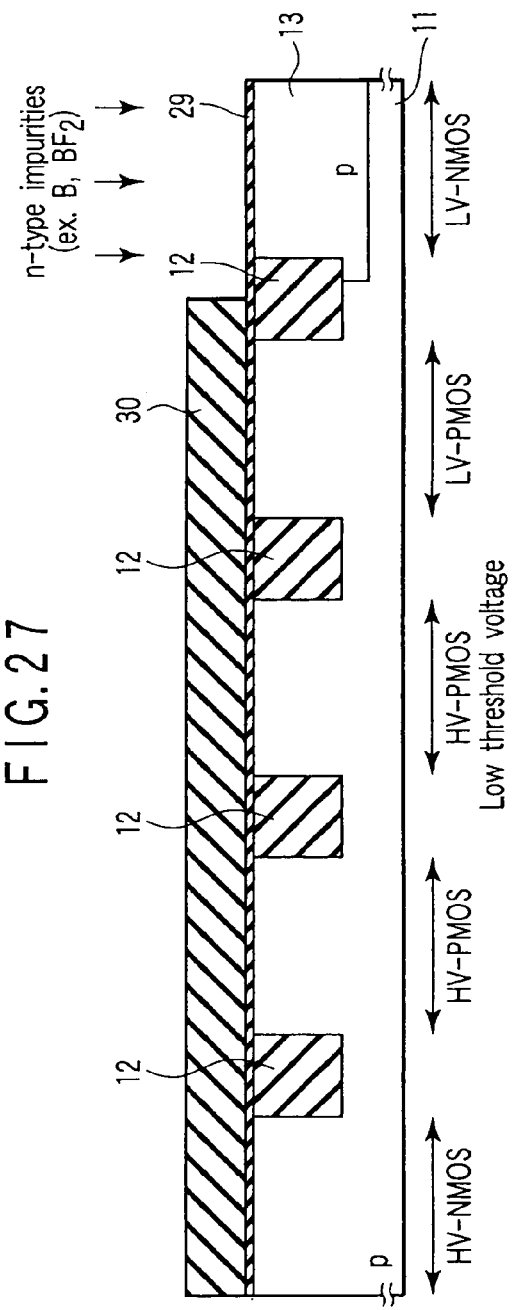
FIG. 28 is a cross-sectional view showing one process of a method of manufacturing the semiconductor device of FIG. 27.

First, as shown in FIG. 28, after forming the element isolation insulating layer 12 of STI structure in the p-type semiconductor substrate 11, a sacrifice oxide layer 29 is formed on the semiconductor substrate 11 by a thermal oxidation method. Further, a resist pattern 30 is formed on the sacrifice oxide layer 29 by a photolithography.

Then, with the resist pattern 30 as a mask, the p-type well region 13 is formed while implanting ion implantation of the p-type impurities (for instance, B, $BF_2$) with, for instance, dose amount $1 \times 10^{12}$ to $1 \times 10^{14}$ cm$^{-2}$ inside the semiconductor substrate 11. After that, the resist pattern 30 is removed by ashing or sulfuric acid hydrogen peroxide mixed chemicals.

Figure 29:
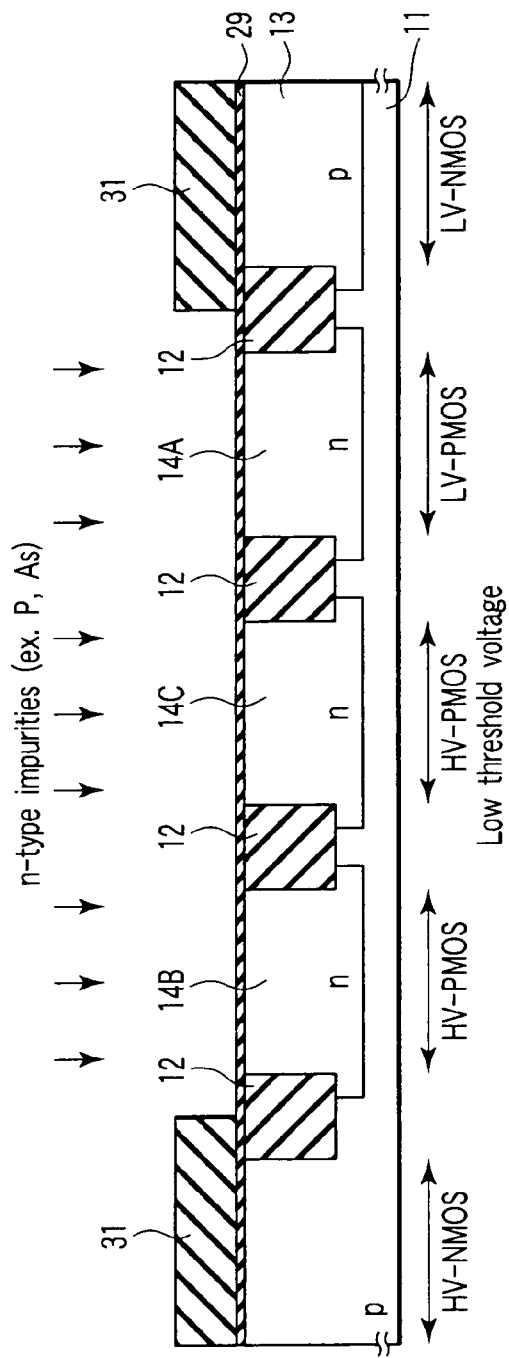
FIG. 29 is a cross-sectional view showing one process of a method of manufacturing the semiconductor device of FIG. 27.

Next, as shown in FIG. 29, a resist pattern 31 is formed again on the sacrifice oxide layer 29 by the photolithography. Then, with the resist pattern 31 as the mask, the n-type well regions 14A, 14B and 14C are formed while implanting ion implantation of the n-type impurities (for instance, P, As) with, for instance, dose amount $1 \times 10^{12}$ to $1 \times 10^{14}$ cm$^{-2}$ inside the semiconductor substrate 11. After that, the resist pattern 31 is removed by ashing or sulfuric acid hydrogen peroxide mixed chemicals.

After that, annealing of temperature of 800 to 1200° C. is implanted for activation of the p-type well region 13 and the n-type well regions 14A, 14B and 14C. Further, the sacrifice oxide layer 29 is removed.

By the way, about formation of the p-type well region 13 and formation of the n-type well regions 14A, 14B and 14C, it is possible for their formation order to be switched.

Figure 30:
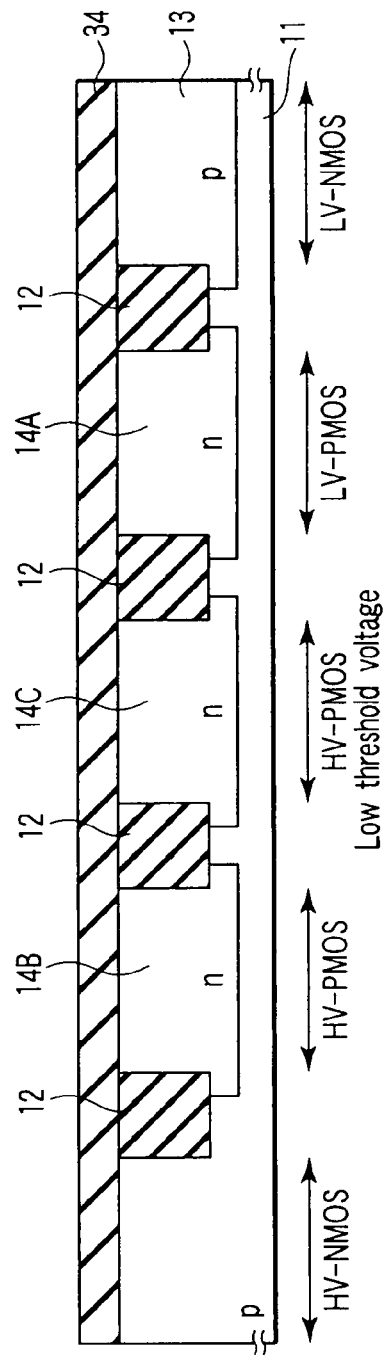
FIG. 30 is a cross-sectional view showing one process of a method of manufacturing the semiconductor device of FIG. 27.

Next, as shown in FIG. 30, a thick gate oxide layer 34 is formed for the high-voltage transistors HV-NMOS, HV-PMOS on the semiconductor substrate 11 by a thermal oxidation method or a CVD method. The thickness of the gate oxide layer 34 is made to be 20 to 80 nm so as to be able to withstand high voltage.

Figure 31:
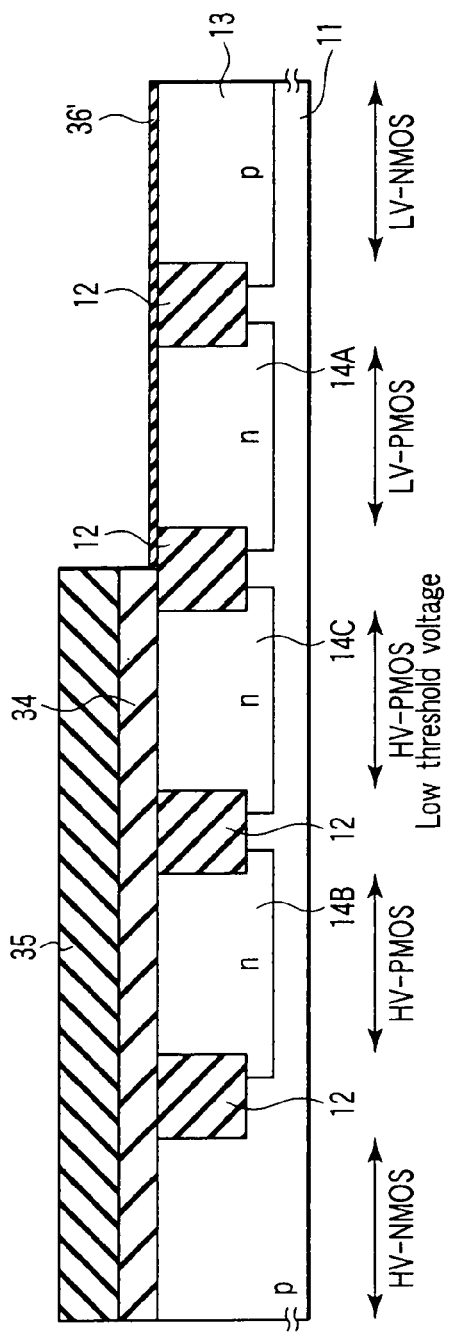
FIG. 31 is a cross-sectional view showing one process of a method of manufacturing the semiconductor device of FIG. 27.

Next, as shown in FIG. 31, by the photolithography, a mask material (hard mask) 35 made of, for instance, silicon nitride is formed on the gate oxide layer 34. The mask material 35 covers the region where the high-voltage transistors HV-NMOS, HV-PMOS and HV-PMOS (low threshold) are formed.

Then, with the mask material 35 as the mask, the thick gate oxide layer 34 which exists on the region where the low-voltage transistors LV-PMOS, LV-NMOS are formed is removed by RIE or liquid chemical.

Continuously, a sacrifice oxide layer 36' is formed on the region where the low-voltage transistors LV-PMOS, LV-NMOS are formed, by sulfuric acid hydro-treatment or ozone treatment. The thickness of the sacrifice oxide layer 36' is made to be 0.5 to 5 nm. After that, the mask material 35 is removed.

Figure 32:
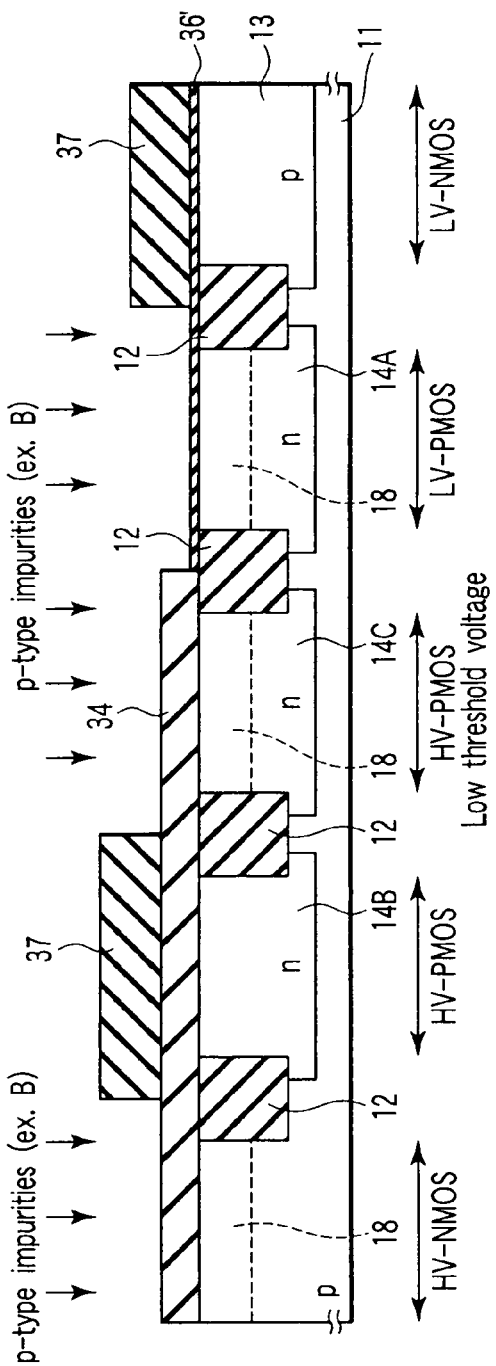
FIG. 32 is a cross-sectional view showing one process of a method of manufacturing the semiconductor device of FIG. 27.

Next, as shown in FIG. 32, the first-time channel implantation is implanted.

The first-time channel implantation is implanted for the threshold control of the n-channel high-voltage transistor HV-NMOS and the p-channel high-voltage transistor HV-PMOS (low threshold).

First, a resist pattern 37 is formed on the gate oxide layer 34 and the sacrifice oxide layer 36' by the photolithography, and with the resist pattern 37 as the mask, the impurity region 18 is formed while implanting the ion implantation of the p-type impurities (for instance, B) with, for instance, dose amount $1 \times 10^{11}$ to $1 \times 10^{13}$ cm$^{-2}$, and acceleration voltage of 12 to 150 keV.

Here, the impurity region 18 by the first-time channel implantation is formed in the region where the high-voltage transistors HV-NMOS, HV-NMOS (low threshold) are formed, and in the region where the low-voltage transistor LV-PMOS is formed.

The impurity region 18 in the region where the low-voltage transistor LV-PMOS is formed forms the peak of the p-type impurities in n-type well region 14A. However, the peak value (density value) thereof is smaller than a peak value of the p-type impurities based on the second-time channel implantation described later by one figure or more, and thus it does not become a large problem when controlling the threshold voltage.

Figure 33:
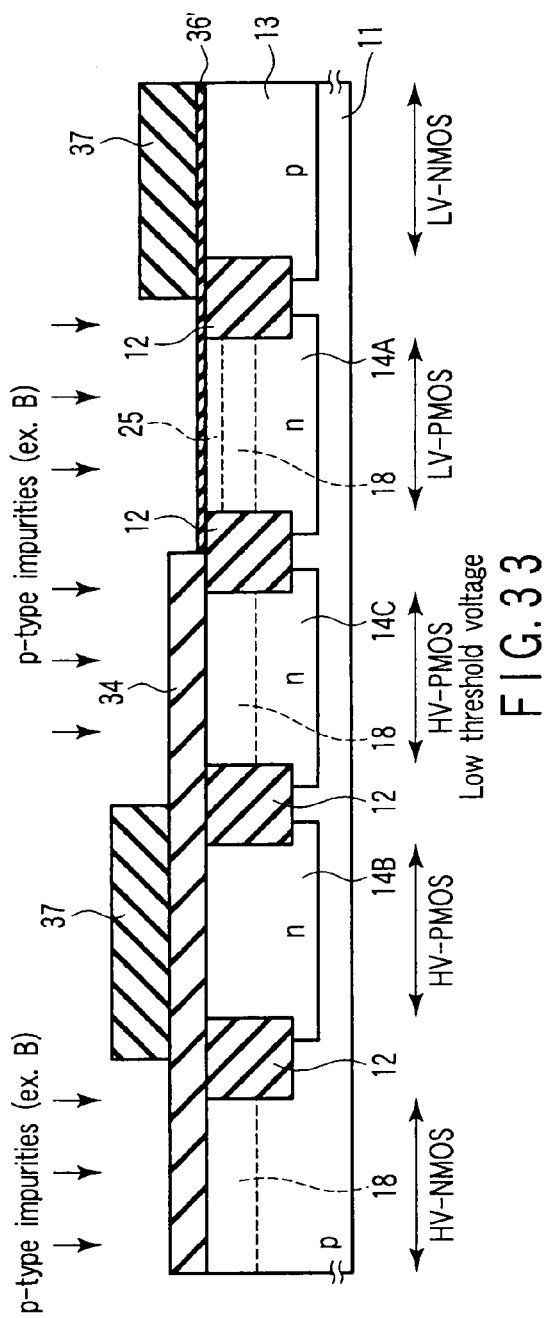
FIG. 33 is a cross-sectional view showing one process of a method of manufacturing the semiconductor device of FIG. 27.

Next, as shown in FIG. 33, the second-time channel implantation is implanted.

The second-time channel implantation is implanted for the threshold control of the p-channel low-voltage transistor LV-PMOS.

The second-time channel implantation is implanted by using the mask material used in the first-time channel implantation, that is, by using the resist pattern 37 as it is. For this reason, compared with the reference example, the number of photolithography process instances decreases by one, and thus it contributes to simplification of the manufacturing process and decrease of the manufacturing cost.

The second-time channel implantation, with the resist pattern 37 as the mask, is implanted while implanting the ion implantation of the p-type impurities (for instance, B) with, for instance, dose amount $1\times10^{12}$ to $1\times10^{14}\,cm^{-2}$, and acceleration voltage of 1 to 10 keV. As a result, an impurity region 25 is formed in the n-type well region 14A where the low-voltage transistor LV-PMOS is formed.

Also in the present example, the first-time channel implantation and the second-time channel implantation are implanted respectively to both the region where the high-voltage transistors HV-NMOS, HV-PMOS (low threshold) are formed and the region where the low-voltage transistor LV-PMOS is formed, while using the same mask. However, the threshold voltage of the both transistors can be controlled independently by utilizing density difference of the impurity regions 18, 25 and the thickness of the gate oxide layer 34.

Additionally, in order that the peak value (density value) of the profile of the impurity region 25 is made larger than that of the profile of the impurity region 18, a dose amount of the second-time channel implantation is made larger than that of the first-time channel implantation.

Further, about the first-time channel implantation and the second channel implantation, it is possible for its order to be switched.

After that, the resist pattern 37 is removed by ashing or sulfuric acid hydrogen peroxide mixed chemicals.

Further, performed is an annealing with temperature of 800 to 1200° C. for activation of the impurity regions 18, 25 with the channel implantation implanted.

Figure 34:
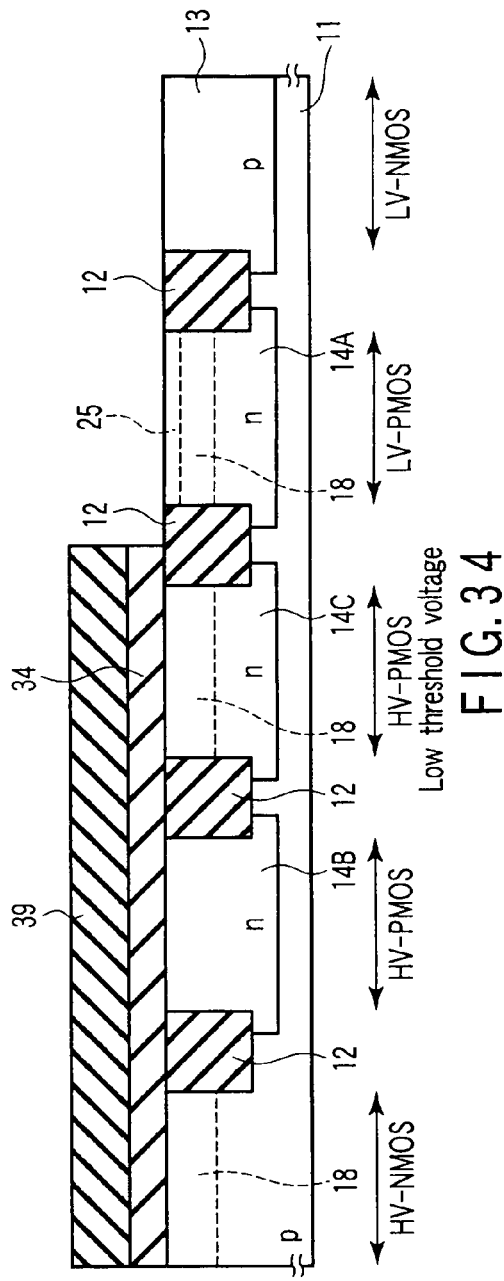
FIG. 34 is a cross-sectional view showing one process of a method of manufacturing the semiconductor device of FIG. 27.

Next, as shown in FIG. 34, the mask material 39 is formed on the gate oxide layer 34. Then, with the mask material 39 as the mask, the sacrifice oxide layer 36' is removed using, for instance a diluted fluoric acid or an ammonium fluoride aqueous solution.

In this case, unlike the above described first and second embodiments, the gate oxide layer 34 of the high-voltage transistors HV-NMOS, HV-PMOS and HV-PMOS (low threshold) is covered by the mask material 39, and thus there is no chance where the gate oxide layer 34 is etched largely, and characteristics of the high-voltage transistors HV-NMOS, HV-PMOS and HV-PMOS (low threshold) are improved.

Next, as shown in FIG. 35, thin gate oxide layers are formed respectively on the p-type well region 13 where the low-voltage transistor LV-NMOS is formed and on the n-type well region 14A where the low-voltage transistor LV-PMOS is formed by the thermal oxidation method or the CVD method.

Next, as shown in FIG. 36, a polysilicon layer is formed, gate electrodes 17, 21, 24, 28 and 28' are formed by processing the polysilicon layer, and gate oxide layers 16, 20, 23, 27 and 27' are formed immediately below the gate electrodes 17, 21, 24, 28 and 28'.

Here, the thickness of the gate oxide layers 20, 23 is made to be 5 to 14 nm, so that it is made approximately ⅓ or less of the thickness of the gate oxide layers 16, 27 and 27'.

After that, a resist pattern for covering the p-channel high-voltage transistors HV-PMOS, HV-PMOS (low threshold) and the p-channel low-voltage transistor LV-PMOS is formed, and the ion implantation of the n-type impurities is implanted to the n-channel high-voltage transistor HV-NMOS and n-channel low-voltage transistor LV-NMOS in a self-alignment manner, with the gate electrodes 17, 21 as the mask, thereby forming source/drain diffusion layers 15, 19.

Further, a resist pattern for covering the n-channel high-voltage transistor HV-NMOS and the n-channel low-voltage transistor LV-NMOS is formed, and the ion implantation of the p-type impurities is implanted to the p-channel high-voltage transistors HV-PMOS, HV-PMOS (low threshold) and p-channel low-voltage transistor LV-PMOS in a self-alignment manner, with the gate electrodes 24, 28 and 28' as the mask, thereby forming source/drain diffusion layers 22, 26 and 26'.

By the above process, the semiconductor device of FIG. 27 is completed.

C. Summary

According to the structure and process of the third embodiment, it is possible to obtain the same effect as the first embodiment. That is, it is possible to realize prevention of the threshold voltage variations and improvement of the short channel effect without the complicated manufacturing process.

Further, together with this, it is possible to prevent variations of the current driving force and variations of cutoff current of transistors formed in the semiconductor device, and thus it is possible to achieve improvement of performance and reliability of the transistor.

Incidentally, concerning the two times of the channel implantations, even though the same mask is used, it is possible for all the transistors to control the threshold voltage independently by utilizing the peak value (density value) of the impurity profile and the thickness of the gate oxide layer of the high-voltage transistor.

The third embodiment suggests that it is possible to execute the channel implantation to plural kinds of transistors (MIS-FET) in which a conductivity type, an operation voltage, a threshold voltage or the like are different from one another, by one mask.

That is, according to the example of the present invention, irrespective of the number of types of the transistor, it is possible to control the threshold voltage of all the transistors by one time photolithography. For this reason, the example of the present invention is effective for, particularly, LSI with multifunction, high performance necessitating plural type of transistors, and the semiconductor memory requiring high integration and high performance.

(4) Fourth Embodiment

A fourth embodiment relates to a manufacturing method of a CMOS circuit constituting a peripheral circuit of a nonvolatile semiconductor memory.

Figure 37:
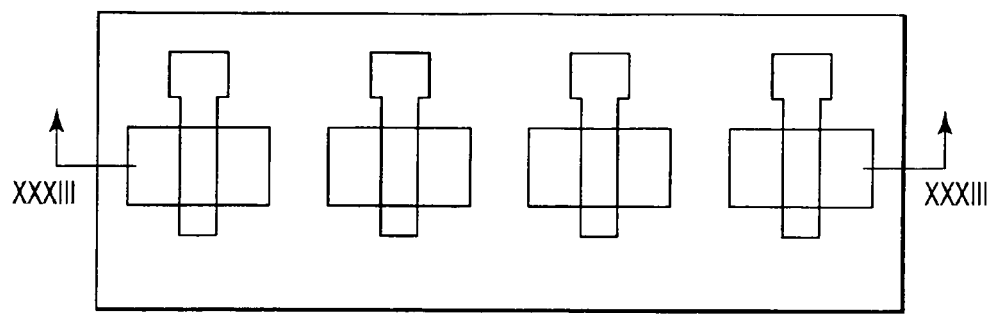
FIG. 37 is a plan view showing one process of a manufacturing method of a fourth embodiment.
Figure 38:
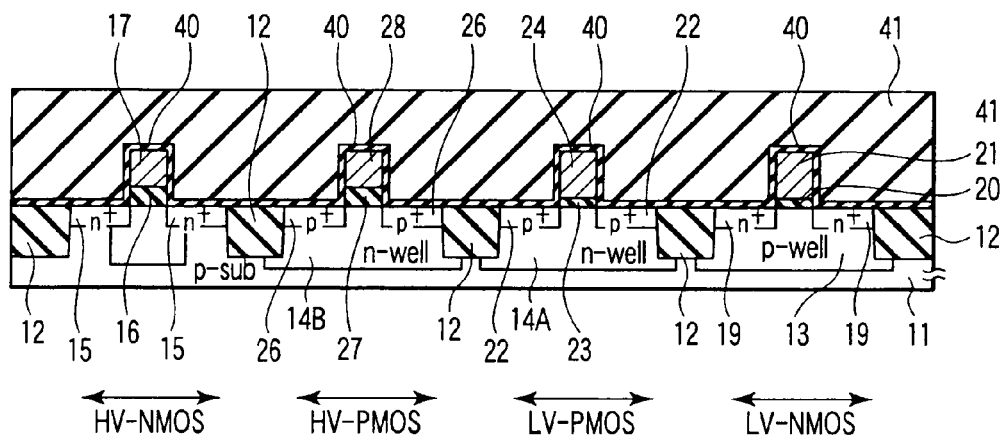
FIG. 38 is a cross-sectional view along line XXXVIII-XXXVIII of FIG. 37.

First, as shown in FIGS. 37 and 38, an element isolation insulating layer 12 of the STI structure made of silicon oxide or silicon nitride is formed in a p-type semiconductor substrate (p-sub) 11. Depth of the element isolation insulating layer 12 is made to be, for instance, 0.1 to 0.4 μm.

After that, the high-voltage transistors HV-NMOS, HV-PMOS and the low-voltage transistors LV-NMOS, LV-PMOS are formed based on the manufacturing method of the above described first or second embodiment, for instance.

Here, the gate electrodes 17, 21, 24 and 28 of these transistors are the polysilicon including the impurities (phosphorus, arsenic or boron) of $1\times10^{17}$ to $1\times10^{21}$ cm$^{-3}$ or stack structure of the polysilicon and silicide (for instance, WSi, NiSi, MoSi, TiSi, CoSi), and its thickness is set to 10 to 500 nm.

Source/drain diffusion layers 15, 19 of the n-channel transistors HV-NMOS, LV-NMOS are formed by implanting the ion implantation of, for instance, phosphorus or arsenic with acceleration voltage of 1 to 50 keV, and dose amount of $1\times10^{14}$ to $1\times10^{16}$ cm$^{-2}$.

Similarly, source/drain diffusion layers 22, 26 of the p-channel transistors HV-PMOS, LV-PMOS are formed by implanting the ion implantation of, for instance, boron with acceleration voltage of 1 to 50 keV, and dose amount of $1\times10^{14}$ to $1\times10^{16}$ cm$^{-2}$.

A barrier layer 40 covering the high-voltage transistors HV-NMOS, HV-PMOS and the low-voltage transistors LV-NMOS, LV-PMOS is formed on the whole surface of the semiconductor substrate 11.

The barrier layer 40 is composed of insulators such as silicon nitride, silicon oxynitride, aluminum oxide or the like, and its thickness is set to 0.5 to 50 nm.

Incidentally, before forming the barrier layer 40, the silicon oxide with thickness of 1 to 50 nm may be formed on a surface of the semiconductor substrate 11 by the thermal oxidation method or CVD method.

After that, an interlayer insulating layer 41 is formed on the barrier layer 40 by the CVD method. The interlayer insulating layer 41 is composed of, for instance, a silicate glass such as silicon oxide, silicon nitride, BPSG or PSG, hydrogen silsesquioxane (HSQ), methyl silsesquioxane (MSQ), coating-type low-dielectric-constant interlayer insulating material (SiLK) or the like, and its thickness is set to 10 to 1000 nm.

Figure 39:
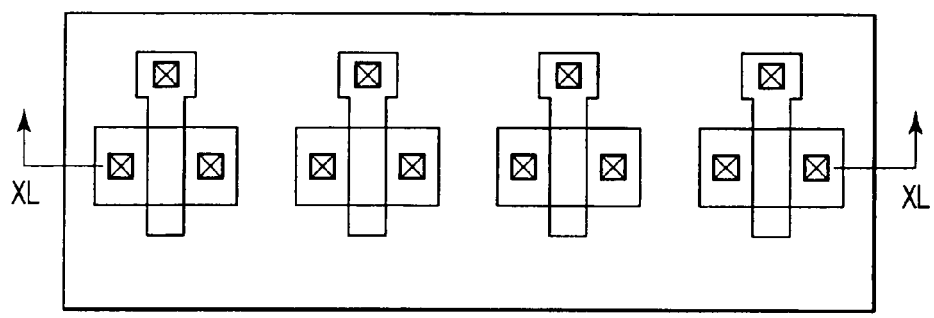
FIG. 39 is a cross-sectional view showing one process of the manufacturing method of the fourth embodiment.

Next, as shown in FIGS. 39 and 40, a resist pattern is formed on the interlayer insulating layer 41, and then, with the resist pattern as the mask, a wiring trench 42A is formed on the interlayer insulating layer 41 while etching the interlayer insulating layer 41 by RIE. After that, the resist pattern is removed.

Further, a resist pattern is formed again on the interlayer insulating layer 41, and then, with the resist pattern as the mask, a contact hole 42B reaching the source/drain layers 15, 19, 22 and 26 is formed on the interlayer insulating layer 41 and the barrier layer 40 while etching the interlayer insulating layer 41 and the barrier layer 40 by the RIE.

Here, when forming the contact hole 42B, the barrier layer 40 is used as an etching stopper.

Therefore, the barrier layer 40 is composed of material having an etching selection ratio to the interlayer insulating layer 41. Due to existence of the barrier layer 40, it is possible to prevent defect of a breakdown voltage drop of the transistor or short circuit, or the like, caused by over etching at the time of formation of the contact hole 42B.

That is, it is possible to prevent the semiconductor substrate 11 or the element isolation insulating layer 12 from being etched largely, by performing formation of the contact hole 42B while dividing the etching into two stages, i.e., the first stage etching of the interlayer insulating layer 41, and the second stage etching of the barrier layer 40. Further, inversely, contact defect that bottom of the contact hole 42 does not reach the source/drain diffusion layers 15, 19, 22 and 26 is hard to occur.

Additionally, it is preferable that the etching of the barrier layer 40 is performed with the RIE condition having the etching selection ratio to both the semiconductor substrate 11 and the interlayer insulating layer 12.

In this case, it is possible to suppress erosion of lateral direction of the interlayer insulating layer 12 in the contact hole 42B compared with process in which the barrier layer 40 is removed by wet etching, therefore, it is possible to minimize size of the contact hole while maintaining forward taper shape of the contact hole 42B.

After forming the contact hole 42B, there is attempted decrease of the contact resistance, while implanting the ion implantation of phosphorus or arsenic with, for instance, dose amount $1\times10^{13}$ to $1\times10^{16}$ cm$^{-2}$ to the source/drain diffusion layers 15, 19 of the n-channel transistors HV-NMOS, LV-NMOS via the contact hole 42B.

Similarly, there is attempted decrease of the contact resistance, while implanting the ion implantation of boron with, for instance, dose amount $1\times10^{13}$ to $1\times10^{16}$ cm$^{-2}$ to the source/drain diffusion layers 22, 26 of the p-channel transistors HV-PMOS, LV-PMOS via the contact hole 42B.

After that, the resist pattern is removed.

Next, as shown in FIG. 41, conductive layers 43A, 43B are formed which fill completely the wiring trench 42A and the contact hole 42B on the interlayer insulating layer 41 by a sputtering method or the CVD method. The conductive layers 43A, 43B are composed of the stack structure of, for instance, barrier metal with thickness of 1 to 100 nm and metal with thickness of 10 to 1000 nm.

The barrier metal is constituted of materials such as, for instance, Ti, Ta, TaN, TiN or the like, and the metal is constituted of materials such as, for instance, tungsten, aluminum, copper or the like.

After that, there is polished (flattened) surfaces of the conductive layers 43A, 43B until the surface of the interlayer insulating layer 41 is exposed by a chemical mechanical polishing (CMP) method.

Figure 42:
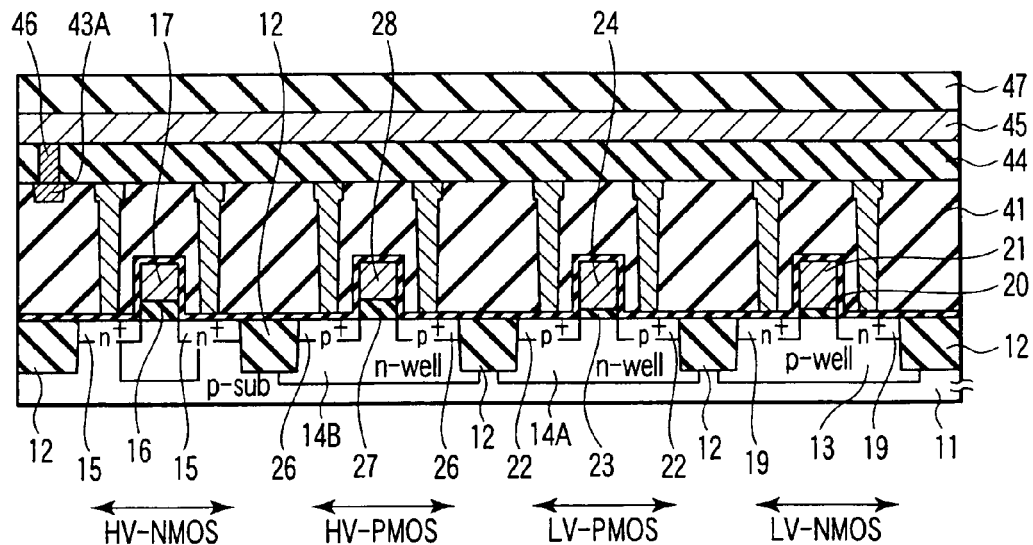
FIG. 42 is a cross-sectional view showing one process of the manufacturing method of the fourth embodiment.

Next, as shown in FIG. 42, an interlayer insulating layer 44 is formed on the interlayer insulating layer 41 by the CVD method. The interlayer insulating layer 44 is composed of, for instance, a silicate glass such as silicon oxide, silicon nitride, BPSG or PSG, HSQ, MSQ, SiLK or the like, and its thickness is set to 10 to 1000 nm.

After that, a via hole reaching the conductive layer 43A is formed on the interlayer insulating layer 44, further, the conductive layer 46 is formed using the sputtering method or the CVD method, and the conductive layer 46 is caused to remain only in the via hole by the CMP method. The conductive layer 46, like the conductive layers 43A, 43B, is composed of the stack structure of, for instance, the barrier metal with thickness of 1 to 100 nm and the metal with thickness of 10 to 1000 nm.

Further, a metal layer 45 composed of, for instance, Al, AlCu with thickness of 10 to 1000 nm is formed on the interlayer insulating layer 44 by the sputtering method. A data transfer line is formed while processing the metal layer 45 into strip-like by the RIE. After that, an interlayer insulating layer 47 covering the metal layer 45 is formed on the interlayer insulating layer 44.

The interlayer insulating layer 47, like the interlayer insulating layers 41, 44, is composed of, for instance, a silicate glass such as silicon oxide, silicon nitride, BPSG or PSG, HSQ, MSQ, SiLK or the like.

Figure 43:
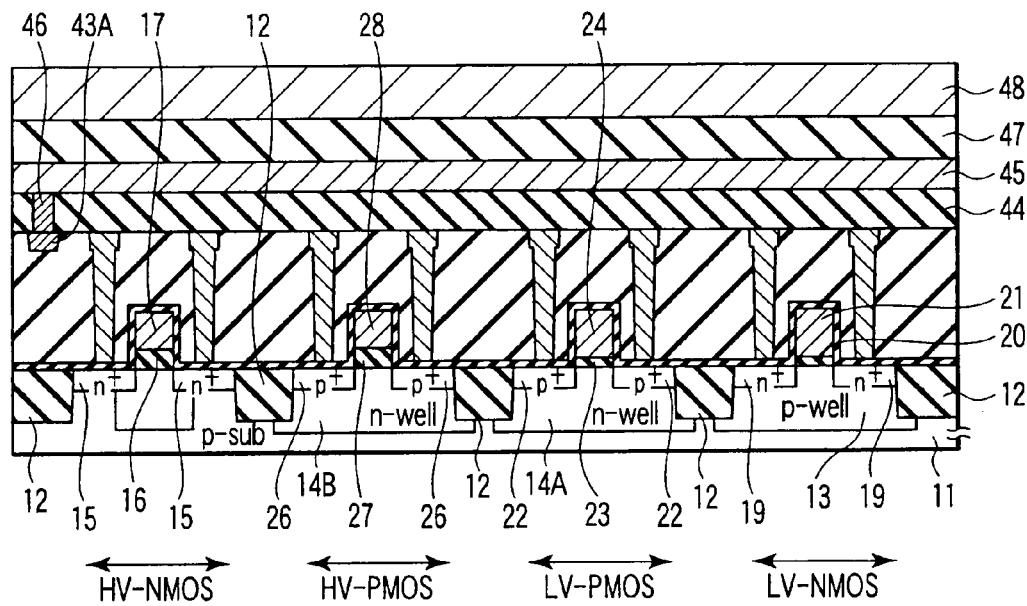
FIG. 43 is a cross-sectional view showing one process of the manufacturing method of the fourth embodiment.

Further, as shown in FIG. 43, a metal layer 48 composed of, for instance, Al, AlCu with thickness of 10 to 1000 nm is formed on the interlayer insulating layer 47 by the sputtering method. The data transfer line is formed while processing the metal layer 48 into strip-shape by the RIE.

Although detailed description of the following process is omitted, generally, a passivation layer composed of silicon nitride or polyimide is formed with thickness of 0.05 to 2.0 μm by plasma CVD method, and thus stress from outer part of the chip such as alpha ray, ultraviolet ray, air or the like is made to decrease.

Due to above process, the CMOS circuit constituting the peripheral circuit of the nonvolatile semiconductor memory is completed.

(5) Fifth Embodiment

A fifth embodiment is one in which, in the above described first to fourth embodiments, the conductivity type of the impurities used in the channel implantation is changed from the p type to the n type.

That is, the threshold voltage of plural types of transistors formed in the same chip can also be controlled by the n-type impurities (for instance, P, As).

Figure 44:
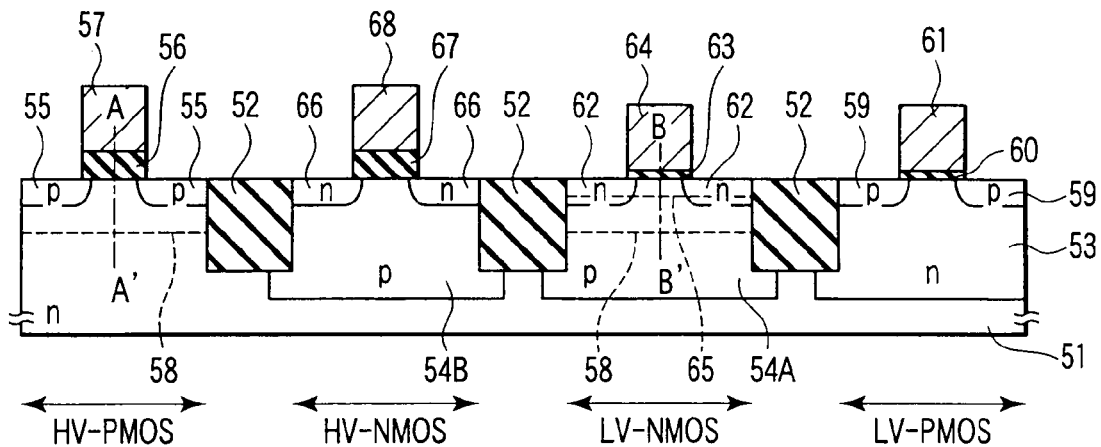
FIG. 44 is a cross-sectional view showing a first example of a semiconductor device of a fifth embodiment.

FIG. 44 shows the first example of a semiconductor device as the fifth embodiment.

An element isolation insulating layer 52 of STI structure is formed in an n-type semiconductor substrate 51. The semiconductor substrate 51 surrounded by the element isolation insulating layer 52 becomes an active area. An n-type well region 53 and p-type well regions 54A, 54B are formed in part of the active area.

A p-channel high-voltage transistor HV-PMOS is formed in the semiconductor substrate 51. The high-voltage transistor HV-PMOS has a source/drain diffusion layer 55, a gate oxide layer 56 and a gate electrode 57.

An impurity region 58 is a region where a channel implantation is implanted for controlling a threshold voltage of the high-voltage transistor HV-PMOS. The channel implantation to the high-voltage transistor HV-PMOS is implanted using, for instance, n-type impurities (for instance, phosphorus, arsenic).

Figure 45:
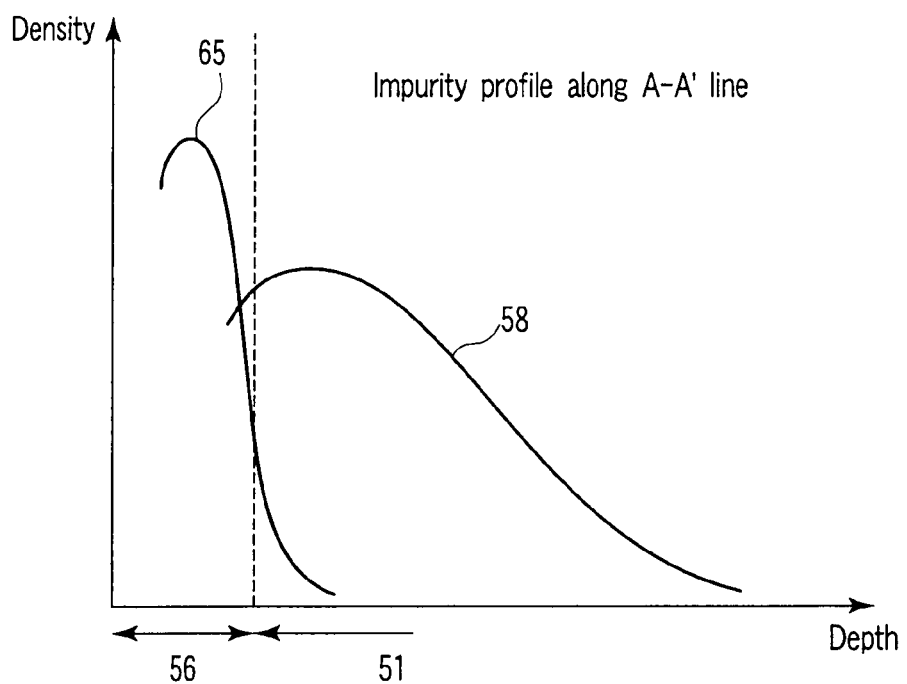
FIG. 45 is a view showing an impurity profile along line A-A' of FIG. 44.

Here, one of peaks of n-type impurity profile along line A-A', for instance, as shown in FIG. 45, exists in the gate oxide layer 56.

A p-channel low-voltage transistor LV-PMOS is formed in an n-type well region 53. The low-voltage transistor LV-PMOS has a source/drain diffusion layer 59, a gate oxide layer 60 and a gate electrode 61. The gate oxide layer 60 is thinner than the gate oxide layer 56.

An n-channel low-voltage transistor LV-NMOS is formed in the p-type well region 54A. The low-voltage transistor LV-NMOS has a source/drain diffusion layer 62, a gate oxide layer 63 and a gate electrode 64.

An impurity region 65 is a region where channel implantation is implanted to control a threshold voltage of the low-voltage transistor LV-NMOS. The channel implantation to the low-voltage transistor LV-NMOS is implanted using, for instance, n-type impurities (for instance, phosphorus, arsenic).

Figure 46:
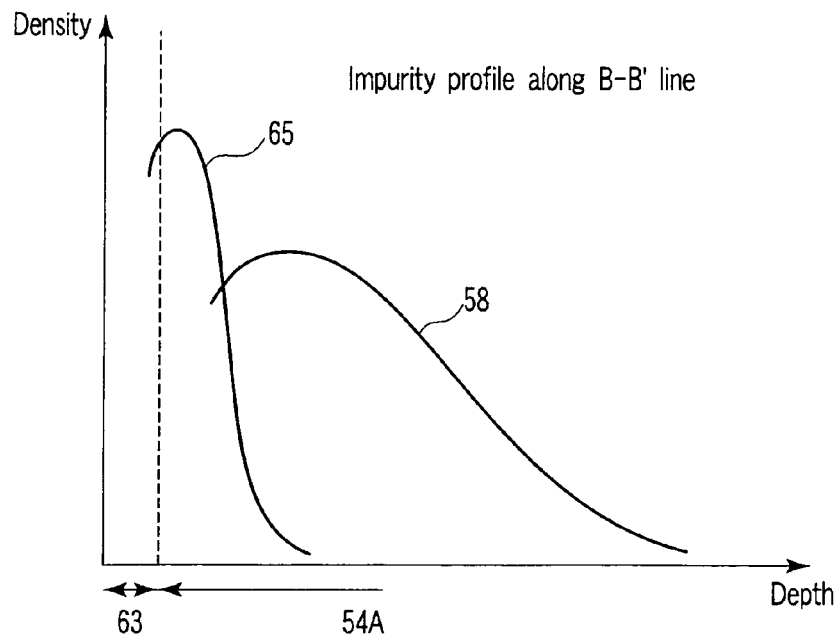
FIG. 46 is a view showing an impurity profile along line B-B' of FIG. 44.

Here, the profile of the n-type impurities along line B-B', for instance, as shown in FIG. 46, has peaks based on the impurity regions 58, 65.

Further, an n-channel high-voltage transistor HV-NMOS is formed in the p-type well region 54B. The high-voltage transistor HV-NMOS has a source/drain diffusion layer 66, a gate oxide layer 67 and a gate electrode 68. The gate oxide layer 67 is thicker than the gate oxide layer 63.

Additionally, concerning the method of manufacturing the semiconductor device of FIG. 44, it is possible to use the manufacturing method (FIGS. 4 to 10) as it is, which is described in the above first embodiment. However, it is necessary for the conductivity type to be changed into n→p, p→n.

Figure 47:
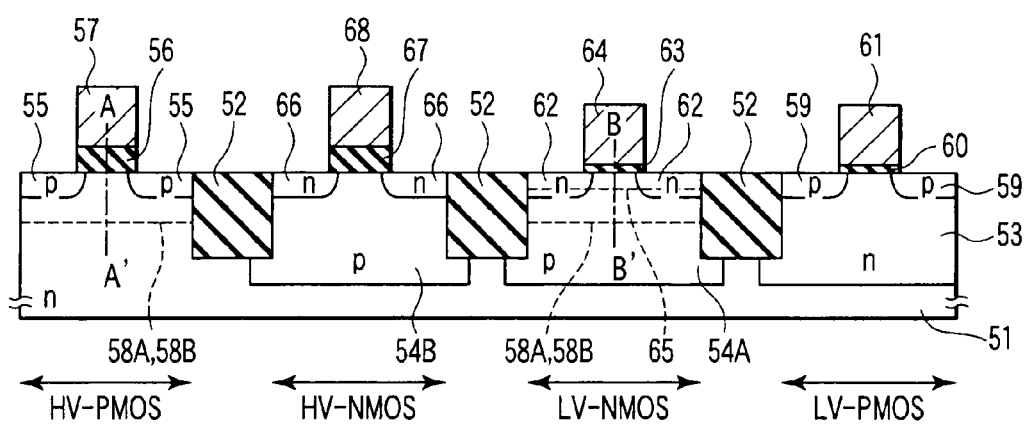
FIG. 47 is a cross-sectional view showing a second example of the semiconductor device of the fifth embodiment.

FIG. 47 shows the second example of the semiconductor device as the fifth embodiment.

An element isolation insulating layer 52 of STI structure is formed in an n-type semiconductor substrate 51. The semiconductor substrate 51 surrounded by the element isolation insulating layer 52 becomes an active area. An n-type well region 53 and p-type well regions 54A, 54B are formed in part of the active area.

A p-channel high-voltage transistor HV-PMOS is formed in the semiconductor substrate 51. The high-voltage transistor HV-PMOS has a source/drain diffusion layer 55, a gate oxide layer 56 and a gate electrode 57.

Impurity regions 58A, 58B are regions where a channel implantation is implanted for controlling a threshold voltage of the high-voltage transistor HV-PMOS. The channel implantation to the high-voltage transistor HV-PMOS is implanted using, for instance, the n-type impurities (for instance, phosphorus, arsenic).

Figure 48:
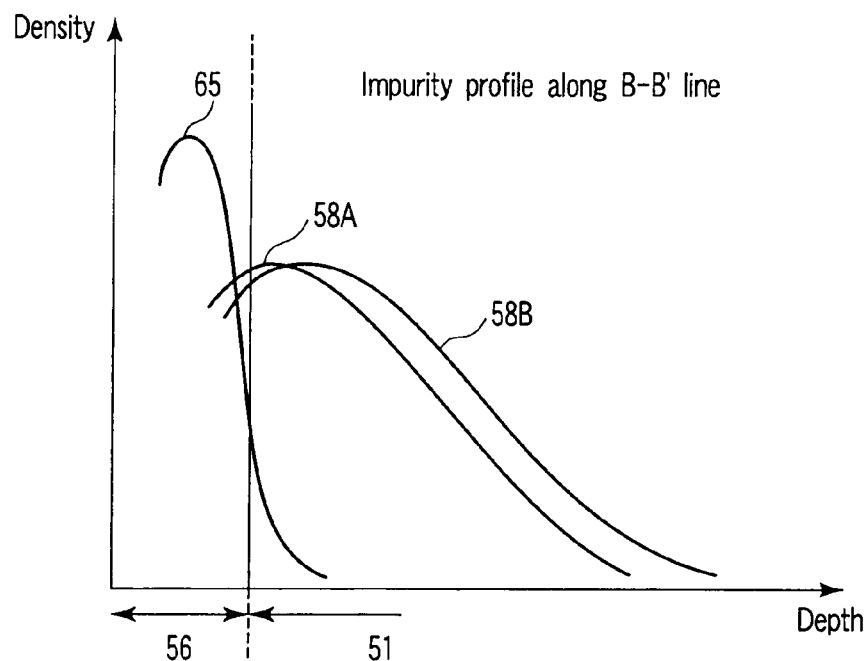
FIG. 48 is a view showing an impurity profile along line A-A' of FIG. 47.

Here, one of peaks of n-type impurity profile along line A-A', for instance, as shown in FIG. 48, exists in the gate oxide layer 56.

A p-channel low-voltage transistor LV-PMOS is formed in the n-type well region 53. The low-voltage transistor LV-PMOS has a source/drain diffusion layer 59, a gate oxide layer 60 and a gate electrode 61. The gate oxide layer 60 is thinner than the gate oxide layer 56.

An n-channel low-voltage transistor LV-NMOS is formed in the p-type well region 54A. The low-voltage transistor LV-NMOS has a source/drain diffusion layer 62, a gate oxide layer 63 and a gate electrode 64.

An impurity region 65 is a region where channel implantation is implanted to control a threshold voltage of the low-voltage transistor LV-NMOS. The channel implantation to the low-voltage transistor LV-NMOS is implanted using, for instance, n-type impurities (for instance, phosphorus, arsenic).

Figure 49:
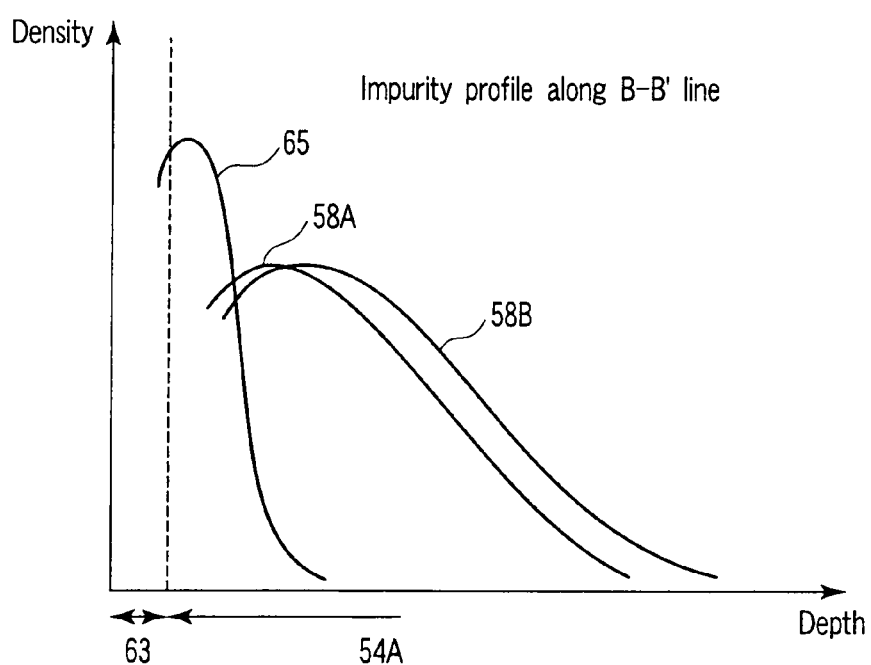
FIG. 49 is a view showing an impurity profile along line B-B' of FIG. 47.

Here, the profile of the n-type impurities along line B-B', for instance, as shown in FIG. 49, has peaks based on the impurity regions 58A, 58B and 65.

Further, the n-channel high-voltage transistor HV-NMOS is formed in the p-type well region 54B. The high-voltage transistor HV-NMOS has a source/drain diffusion layer 66, a gate oxide layer 67 and a gate electrode 68. The gate oxide layer 67 is thicker than the gate oxide layer 63.

Additionally, concerning the method of manufacturing the semiconductor device of FIG. 47, it is possible to use the manufacturing method (FIGS. 14 to 20) as it is, which is described in the above second embodiment. However, it is necessary for the conductivity type to be changed into n→p, p→n.

4. Others

In the above first to fifth embodiments, following changes are possible.

Concerning the element isolation insulating layer and the interlayer insulating layer, it is possible to use a method of oxidizing silicon, and a method in which oxygen ion is injected to silicon before it is converted into silicon oxide by annealing, in addition to the method in which the silicon oxide is formed directly by the CVD method or the like.

As for the semiconductor substrate, it is composed of the crystal including silicon such as SiGe mixed crystal, SiGeC mixed crystal in addition to a silicon single crystal.

The gate electrode and the wiring layer of MISFET are capable of using SiGe mixed crystal, SiGeC mixed crystal, silicide, polycide, metal or lamination thereof.

It is preferable, as the silicide or the polycide, to use TiSi, NiSi, CoSi, TaSi, WSi, MoSi, or the like, and it is preferable, as the metal, to use Ti, Al, Cu, TiN, W or the like. These materials may be single crystal or multi crystal.

The gate electrode of MISFET is also capable of being composed of amorphous Si, amorphous SiGe, or amorphous SiGeC, and in this case, it is preferable for the gate electrode to be formed into laminated structure of these materials and another material.

When applying the example of the present invention to the nonvolatile semiconductor memory, it is possible to adopt process in which MISFET and the memory cell having stack gate structure are formed simultaneously.

The example of the present invention can be applied to general semiconductor integrated circuit having plural type of MISFETs. Among them, it is particularly effective for the example of the present invention to be applied to the peripheral circuit of the NAND flash memory.

5. Summary

According to the examples of the present invention, it is possible to realize prevention of the threshold voltage variations and improvement of the short channel effect without the complicated manufacturing process.

That is, for instance, concerning the p-channel low-voltage transistor and n-channel high-voltage transistor obtained by the channel implantation of the boron, it is possible to suppress variation of the threshold voltage caused by suction of the boron occurring at oxidation process of the gate oxide layer, and it becomes possible to obtain the required threshold voltage.

In particular, in the p-channel low-voltage transistor being an embedded channel, since it is possible to obtain the accurate and steep impurity profile while suppressing diffusion of the impurities, the short channel effect is improved, and it is possible to realize the semiconductor device with high performance and high accuracy.

Further, due to this, it is possible to suppress variation of the current driving force of the p-channel low-voltage transistor, and to reduce variation of the cutoff current. Concerning the impurity profile in the channel region of the n-channel high-voltage transistor, since it becomes a steep shape in the surface of the semiconductor substrate, a back gate bias effect is small, and thus it is possible to provide the MISFET with a good cutoff characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a first insulating layer on a first semiconductor region of a first conductivity type;
    forming a second insulating layer thinner than the first insulating layer on a second semiconductor region of a second conductivity type;
    implanting first impurities simultaneously in the first and second semiconductor regions with a condition that a peak of a profile of the first impurities of a first conductivity type is formed in the first and second semiconductor regions;
    implanting second impurities simultaneously in the first and second semiconductor regions with a condition that a peak of a profile of the second impurities of a first conductivity type is formed in the first insulating layer;
    forming a first MIS transistor of a second conductivity type with the first insulating layer as a gate insulating layer in the first semiconductor region; and
    forming a second MIS transistor of a first conductivity type in the second semiconductor region.

2. The method according to claim 1,
    wherein a peak of a profile of the first impurities in the first semiconductor region is formed in a channel region adjacent to the first insulating layer.

3. The method according to claim 1,
    wherein a peak of a profile of the second impurities in the second semiconductor region is formed in a channel region adjacent to the second insulating layer.

4. The method according to claim 1,
    wherein difference between a peak of a profile of the first impurities and a peak of a profile of the second impurities is a factor of ten or more.

5. The method according to claim 1,
    wherein the first insulating layer is also formed on a third semiconductor region of a second conductivity type, a third MIS transistor of a first conductivity type with the first insulating layer as a gate insulating layer is formed in the third semiconductor region, and a threshold voltage of the third MIS transistor is lower than a threshold voltage of the first MIS transistor.

6. The semiconductor device according to claim 1,
    wherein a peak of a profile of impurities of the first conductivity type in a channel region of the first MIS transistor is smaller than a peak having the highest density among the peaks of the profiles of the first and second impurities.

* * * * *